US012613603B2

(12) United States Patent
Han et al.

(10) Patent No.: US 12,613,603 B2
(45) Date of Patent: Apr. 28, 2026

(54) DISPLAY DEVICE

(71) Applicant: Samsung Display Co., Ltd., Yongin-si (KR)

(72) Inventors: Hyeyun Han, Yongin-si (KR); Gyeongnam Bang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/043,067

(22) Filed: Jan. 31, 2025

(65) Prior Publication Data

US 2025/0306722 A1     Oct. 2, 2025

(30) Foreign Application Priority Data

Mar. 26, 2024     (KR) ......................... 10-2024-0041373

(51) Int. Cl.
*G06F 3/044*          (2006.01)
*H10H 29/34*        (2025.01)
*H10H 29/49*        (2025.01)

(52) U.S. Cl.
CPC ........... *G06F 3/0446* (2019.05); *H10H 29/34* (2025.01); *H10H 29/49* (2025.01)

(58) Field of Classification Search
CPC .. G06F 3/04164; G06F 3/0446; G06F 3/0443; G06F 3/0448; G06F 3/0412; G06F 2203/04112; H10K 59/12; H10K 59/40; H10H 29/49; H10H 29/34
See application file for complete search history.

(56) References Cited

U.S. PATENT DOCUMENTS

| | | | |
|---|---|---|---|
| 10,665,158 B2 | 5/2020 | Lee et al. | |
| 10,732,762 B2 | 8/2020 | Na et al. | |
| 11,523,522 B2 | 12/2022 | Lee et al. | |
| 11,579,736 B2 | 2/2023 | Jeong et al. | |

(Continued)

FOREIGN PATENT DOCUMENTS

| | | |
|---|---|---|
| KR | 10-2020-0031002 A | 3/2020 |
| KR | 10-2147842 B1 | 8/2020 |

(Continued)

OTHER PUBLICATIONS

International Search Report and Written Opinion of the International Searching Authority, mailed Mar. 20, 2025, corresponding to PCT/KR2024/096740, 156 pages.

*Primary Examiner* — Deeprose Subedi
(74) *Attorney, Agent, or Firm* — Womble Bond Dickinson (US) LLP

(57) ABSTRACT

A display device including a display panel and an input sensor. The input sensor includes first line elements extending in a second direction and second line elements extending in a first direction. A portion of the disconnection area is defined in at least one of two first line elements on opposite sides of a first color light emitting area among first line elements and defined in at least one of two second line elements disposed on opposite sides of the first color light emitting area among second line elements. A portion of the disconnection area is not defined in one of the two first line elements on the opposite sides of the first color light emitting area, and a portion of the disconnection area is not defined in one of the two second line elements on the opposite sides of the first color light emitting area.

25 Claims, 15 Drawing Sheets

(56)          References Cited

U.S. PATENT DOCUMENTS

| | | | |
|---|---|---|---|
| 11,740,718 | B2 | 8/2023 | Choi et al. |
| 11,861,126 | B2 | 1/2024 | Bok et al. |
| 11,864,449 | B2 | 1/2024 | Park et al. |
| 2022/0069027 | A1* | 3/2022 | Wang ................... G09G 3/2003 |
| 2023/0157102 | A1 | 5/2023 | Du et al. |

FOREIGN PATENT DOCUMENTS

| | | |
|---|---|---|
| KR | 10-2348106 B1 | 1/2022 |
| KR | 10-2022-0045584 A | 4/2022 |
| KR | 10-2022-0089770 A | 6/2022 |
| KR | 10-2508256 B1 | 3/2023 |
| KR | 10-2023-0048188 A | 4/2023 |
| KR | 10-2023-0108771 A | 7/2023 |

* cited by examiner

DISPLAY DEVICE

CROSS-REFERENCE TO RELATED APPLICATION

The present application claims priority to and the benefit of Korean Patent Application No. 10-2024-0041373, filed on Mar. 26, 2024, in the Korean Intellectual Property Office, the entire disclosure of which is incorporated herein by reference.

BACKGROUND

Embodiments of the present disclosure described herein are related to a display device, and for example, are related to a display device including an input sensor.

Various display devices are being developed for use in multimedia applications, such as televisions, mobile phones, tablet computers, car navigation units, game machines, and/or the like. These display devices may include input devices, such as keyboards and/or mouses. Additionally, these display devices may include input sensors as input devices.

The above information disclosed in this Background section is only for enhancement of understanding of the background of the disclosure and therefore it may contain information that does not constitute prior art.

SUMMARY

Aspects according to one or more embodiments of the present disclosure are directed toward a display device including an input sensor having a sensing electrode, the visibility of which is reduced.

Additional aspects will be set forth in part in the description which follows and, in part, will be apparent from the description, or may be learned by practice of the presented embodiments of the disclosure.

According to one or more embodiments, a display device includes a display panel including a plurality of unit areas and an input sensor that is arranged on the display panel and that includes a sensing electrode. Each of the plurality of unit areas includes first, second, third, and fourth sub-areas, and each of the first, second, third, and fourth sub-areas includes a first color light emitting area, a second color light emitting area, and a third color light emitting area. In each of the first, second, third, and fourth sub-areas, the third color light emitting area is arranged on a (e.g., one) side of each of the first, second, third, and fourth sub-areas in a first direction from the first color light emitting area and the second color light emitting area (i.e., the direction that from the first color light-emitting area and the second color light-emitting area), and the first color light emitting area is aligned with the second color light emitting area in a second direction crossing the first direction. The first sub-area and the second sub-area are aligned with each other in the second direction, the third sub-area and the fourth sub-area are aligned with each other in the second direction, the third sub-area is arranged on the one side of the first sub-area in the first direction from the first sub-area, and the fourth sub-area is arranged on the one side of the second sub-area in the first direction from the second sub-area. The sensing electrode includes a line element that defines a first opening area, a second opening area, and a third opening area corresponding to the first color light emitting area, the second color light emitting area, and the third color light emitting area, respectively. The line element includes a first line element being further extended in the second direction and a second line element being further extended in the first direction. A first disconnection area is defined in a portion of the second line element arranged between the second color light emitting area of the first sub-area and the first color light emitting area of the second sub-area corresponding to a first unit area among the plurality of unit areas, and a second disconnection area is defined in a portion of the first line element arranged between the second color light emitting area of the first sub-area and the third color light emitting area of the first sub-area corresponding to the first unit area. A third disconnection area is defined in a portion of the second line element arranged on one side of the second color light emitting area of the second sub-area spaced farther away from the first color light emitting area of the second sub-area corresponding to the first unit area than other sides of the second color light emitting area of the second sub-area (i.e., here, the one side of the second color light-emitting area of the second sub-area is the side that is farther away from the first color light-emitting area of the second sub-area than other sides of the second color light-emitting area, corresponding to the first unit area), and a fourth disconnection area is defined in a portion of the first line element arranged on one side of the second color light emitting area of the second sub-area spaced farther away from the third color light emitting area of the second sub-area corresponding to the first unit area than other sides of the second color light emitting area of the second sub-area (i.e., here, the one side of the second color light-emitting area of the second sub-area is the side farther away from the third color light-emitting area of the second sub-area than other sides of the second color light-emitting area, corresponding to the first unit area). A fifth disconnection area is defined in a portion of the second line element arranged between the first color light emitting area of the third sub-area and the second color light emitting area of the third sub-area corresponding to the first unit area, and a sixth disconnection area is defined in a portion of the first line element arranged between the second color light emitting area of the third sub-area and the third color light emitting area of the third sub-area corresponding to the first unit area. A seventh disconnection area is defined in a portion of the second line element arranged between the first color light emitting area of the fourth sub-area and the second color light emitting area of the fourth sub-area corresponding to the first unit area, and an eighth disconnection area is defined in a portion of the first line element arranged between the second color light emitting area of the fourth sub-area and the third color light emitting area of the second sub-area corresponding to the first unit area.

The third color light emitting area of the first sub-area and the third color light emitting area of the second sub-area may be arranged (e.g., commonly arranged) in the third opening area.

A portion of the third opening area where the third color light emitting area of the third sub-area is arranged and a portion of the third opening area where the third color light emitting area of the fourth sub-area is arranged may be different opening areas from each other.

A portion of the second line element arranged between the third color light emitting area of the third sub-area and the third color light emitting area of the fourth sub-area may have a line width greater than a line width of a portion of the second line element arranged between the second color light emitting area of the third sub-area and the first color light emitting area of the fourth sub-area.

A portion of the second line element arranged between the second color light emitting area of the third sub-area and the first color light emitting area of the fourth sub-area may have substantially the same line width as a portion of the second line element arranged between the first color light emitting area of the third sub-area and the second color light emitting area of the third sub-area.

A first gap between the third color light emitting area of the first sub-area and the third color light emitting area of the second sub-area may be smaller than a second gap between the third color light emitting area of the third sub-area and the third color light emitting area of the fourth sub-area.

The sensing electrode may include a first sensing electrode and a second sensing electrode arranged adjacent to each other. An end of the line element of the first sensing electrode and an end of the line element of the second sensing electrode may be spaced and/or apart (e.g., spaced apart or separated) from each other between the first sensing electrode and the second sensing electrode to define a boundary disconnection area. At least one of the first to eighth disconnection areas may be the boundary disconnection area between the first sensing electrode and the second sensing electrode.

The plurality of unit areas may include a second unit area different from the first unit area. The first to eighth disconnection areas may be defined in the line element corresponding to the first unit area. Disconnection areas arranged differently from the first to eighth disconnection areas may be defined in the line element corresponding to the second unit area.

The first color light emitting area may have a smaller area than the second color light emitting area, and the third color light emitting area may have a larger area than the second color light emitting area.

The line element may include a first metal layer and a second metal layer arranged on the first metal layer, and the first metal layer may have a higher electrical conductivity and a higher reflectivity than the second metal layer.

According to one or more embodiments, a display device includes a display panel including a plurality of unit areas and an input sensor that is arranged on the display panel and that includes a first sensing electrode and a second sensing electrode. Each of the plurality of unit areas includes first, second, third, and fourth sub-areas, and each of the first, second, third, and fourth sub-areas includes a first color light emitting area, a second color light emitting area, and a third color light emitting area. In each of the first, second, third, and fourth sub-areas, the third color light emitting area is arranged on one side of each of the first, second, third, and fourth sub-areas in a first direction from the first color light emitting area and the second color light emitting area, and the first color light emitting area is aligned with the second color light emitting area in a second direction normal (e.g., perpendicular) to the first direction. The first sub-area and the second sub-area are aligned with each other in the second direction, the third sub-area and the fourth sub-area are aligned with each other in the second direction, the third sub-area is arranged on the one side of the first sub-area in the first direction from the first sub-area, and the fourth sub-area is arranged on the one side of the second sub-area in the first direction from the second sub-area. Each of the first sensing electrode and the second sensing electrode includes a line element that defines a first opening area, a second opening area, and a third opening area corresponding to the first color light emitting area, the second color light emitting area, and the third color light emitting area, respectively. Each of line elements of the first sensing electrode and the second sensing electrode includes first line elements being further extended in the second direction and second line elements being further extended in the first direction. A portion of the disconnection area is defined in at least one of two first line elements arranged on opposite sides of the first color light emitting area selected from among the first line elements of each of the first sensing electrode and the second sensing electrode and defined in at least one of two second line elements arranged on opposite sides of the first color light emitting area selected from among the second line elements of each of the first sensing electrode and the second sensing electrode. A portion of the disconnection area is not defined in one of the two first line elements arranged on the opposite sides of the first color light emitting area selected from among the first line elements of each of the first sensing electrode and the second sensing electrode, and a portion of the disconnection area is not defined in one of the two second line elements arranged on the opposite sides of the first color light emitting area selected from among the second line elements of each of the first sensing electrode and the second sensing electrode.

The third color light emitting area of the first sub-area and the third color light emitting area of the second sub-area may be arranged (e.g., commonly arranged) in the third opening area.

A portion of the third opening area where the third color light emitting area of the third sub-area is arranged and a portion of the third opening area where the third color light emitting area of the fourth sub-area is arranged may be different opening areas from each other.

The second line elements arranged between the third color light emitting area of the third sub-area and the third color light emitting area of the fourth sub-area may have a line width greater than a line width of the second line elements arranged between the second color light emitting area of the third sub-area and the first color light emitting area of the fourth sub-area.

The second line elements arranged between the second color light emitting area of the third sub-area and the first color light emitting area of the fourth sub-area may have substantially the same line width as the second line elements arranged between the first color light emitting area of the third sub-area and the second color light emitting area of the third sub-area.

A first gap between the third color light emitting area of the first sub-area and the third color light emitting area of the second sub-area may be smaller than a second gap between the third color light emitting area of the third sub-area and the third color light emitting area of the fourth sub-area.

An end of the line element of the first sensing electrode and an end of the line element of the second sensing electrode may be spaced and/or apart (e.g., spaced apart or separated) from each other between the first sensing electrode and the second sensing electrode to define a boundary disconnection area.

Two second line elements arranged on opposite sides of the first color light emitting area selected from among the second line elements of the first sensing electrode and two second line elements arranged on opposite sides of the first color light emitting area selected from among the second line elements of the second sensing electrode may be spaced and/or apart (e.g., spaced apart or separated) from each other between the first sensing electrode and the second sensing electrode to define two boundary disconnection areas.

The two second line elements of the first sensing electrode that are arranged on the opposite sides of the first color light emitting area and that define the boundary disconnection areas may have substantially the same length as a disconnected second line element that defines the first sensing electrode and that is arranged on one side of the first color light emitting area.

Between the first sensing electrode and the second sensing electrode, two first line elements arranged on opposite sides of the third color light emitting area among the first line elements of the first sensing electrode may be spaced and/or apart (e.g., spaced apart or separated) from the second sensing electrode to define two boundary disconnection areas.

BRIEF DESCRIPTION OF THE DRAWINGS

The above and other objects and features of the present disclosure will become apparent by describing in more detail embodiments thereof with reference to the accompanying drawings.

DETAILED DESCRIPTION

Figure 1:
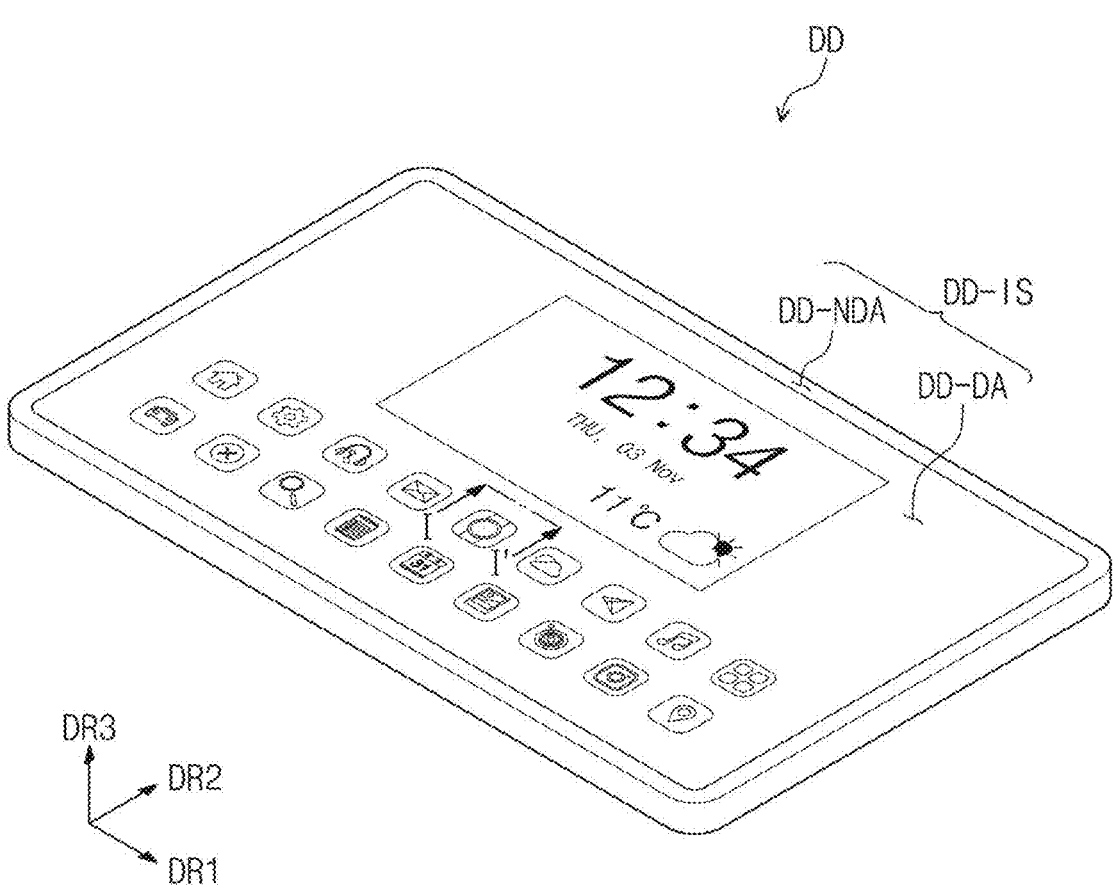
FIG. 1 is a perspective view of a display device according to one or more embodiments of the present disclosure.

In this specification, if (e.g., when) a component or layer is referred to as being "on", "connected to" or "coupled to" another component or layer, it may be understood that the component or layer may be directly on, connected to, or coupled to the other component or layer or a third component may be present therebetween. In contrast, if (e.g., when) a component or layer is referred to as being "directly on", "directly connected to" or "directly coupled to" another component or layer, a third component may not be present therebetween.

In the present specification, "including A or B", "A and/or B", etc., represents A or B, or A and B.

As used herein, the term "and/or" includes any and all combinations of one or more of the associated listed items. As used herein, expressions such as "at least one of", "one of", and "selected from", when preceding a list of elements, modify the entire list of elements and do not modify the individual elements of the list. For example, "at least one of a, b or c", "at least one selected from a, b and c", etc., may indicate only a, only b, only c, both (e.g., simultaneously) a and b, both (e.g., simultaneously) a and c, both (e.g., simultaneously) b and c, all of a, b, and c, or variations thereof.

Identical reference numerals refer to substantially identical components. Additionally, in the drawings, the thicknesses, proportions, and dimensions of components are exaggerated for effective description. As used herein, the term "and/or" includes all of one or more combinations defined by related components.

Terms such as first, second, and/or the like may be used to describe one or more suitable components, areas, and/or layers, but the components, areas, and/or layers should not be limited by the terms. The terms may be used only for distinguishing one component from other components. For example, without departing from the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship between components illustrated in the drawings. The terms are relative concepts and are described based on directions illustrated in the drawing.

It should be understood that terms such as "comprise", "include", and "have", if (e.g., when) used herein, specify the presence of stated features, numbers, steps, operations, components, parts, and/or one or more (e.g., any suitable) combinations thereof, but do not preclude the presence or addition of one or more other features, numbers, steps, operations, components, parts, and/or one or more (e.g., any suitable) combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively (or substantially) formal meanings unless clearly defined as having such in the present application.

Hereinafter, one or more embodiments of the present disclosure will be described with reference to the accompanying drawings.

FIG. 1 is a perspective view of a display device DD according to one or more embodiments of the present disclosure. As illustrated in FIG. 1, the display device DD may display an image through a display surface DD-IS. The display surface DD-IS is parallel to a plane defined by a first direction DR1 and a second direction DR2. The normal direction (e.g., the perpendicular direction) of the display surface DD-IS, that is, the thickness direction of the display device DD is indicated by a third directional axis DR3. Here, a plan view may refer to a view as seen from above the plane in the direction of axis DR3.

Front surfaces (or, upper surfaces) and rear surfaces (or, lower surfaces) of members or units that will be described in more detail are distinguished from each other based on the third direction DR3. However, the first to third directions DR1, DR2, and DR3 illustrated in this embodiment are merely illustrative.

In one or more embodiments of the present disclosure, the display device DD having a flat display surface is illustrated. However, the present disclosure is not limited thereto. The display device DD may include a curved display surface or a three-dimensional display surface. The three-dimensional display surface may include a plurality of display areas indicating different directions. The three-dimensional display surface may include, for example, a bent display surface. The display device DD according to this embodiment may be a foldable display device DD. The foldable display device DD may be a foldable display device capable of being folded.

In one or more embodiments, the display device DD that is able to be applied to a tablet terminal may be illustrated as an example. Electronic modules, a camera module, and a power module mounted on the main board, together with the display device DD, may be arranged or accommodated in a bracket or case or housing and may constitute the tablet terminal. The display device DD according to the present disclosure may be applied to small and medium-sized electronic devices, such as a mobile phone, a car navigation unit, a game machine, and a smart watch, as well as large electronic devices such as a television and a monitor.

As illustrated in FIG. 1, the display surface DD-IS includes an image area DD-DA on which the image is displayed and a bezel area DD-NDA adjacent to the image area DD-DA. The bezel area DD-NDA is an area where the image is not displayed. In FIG. 1, icon images are illustrated as an example of the image.

As illustrated in FIG. 1, the image area DD-DA may have a substantially quadrangular shape. The "substantially quadrangular shape" includes not only a quadrangular shape in a mathematical sense but also a quadrangular shape in which curved boundaries rather than vertexes are defined in vertex areas (or, corner areas).

The bezel area DD-NDA may be around (e.g., may surround) the image area DD-DA. However, without being limited thereto, the shape of the bezel area DD-NDA may be modified. For example, the bezel area DD-NDA may be arranged on only a (e.g., one) side of the image area DD-DA.

Figure 2:
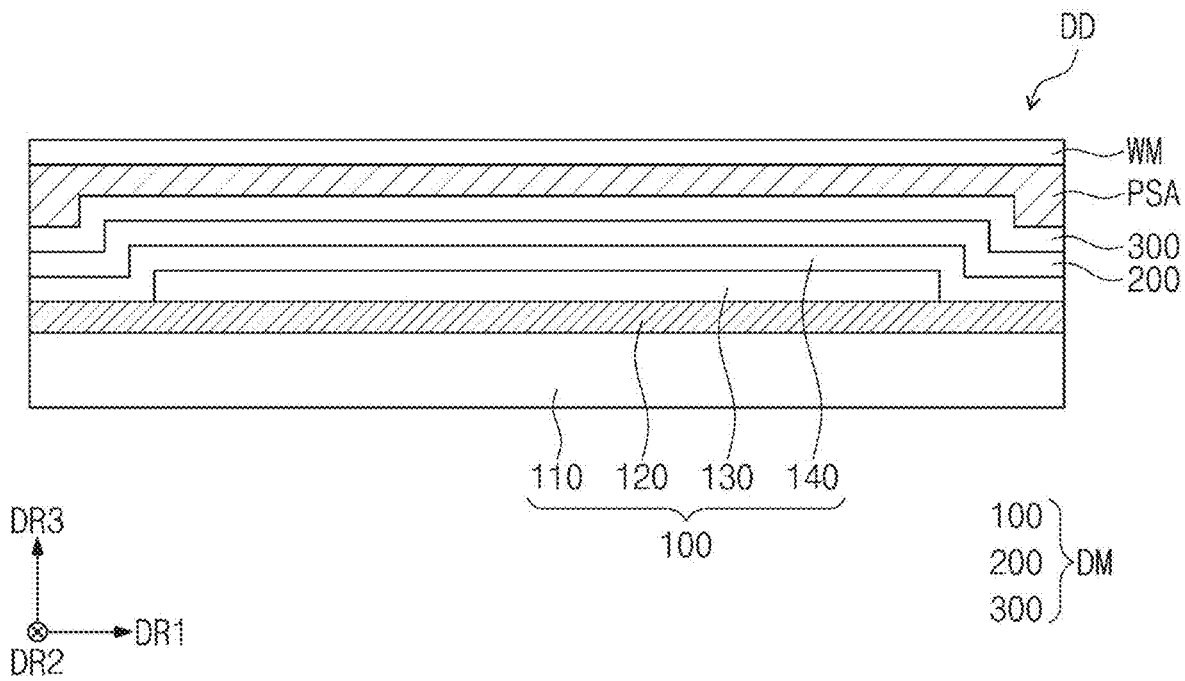
FIG. 2 is a cross-sectional view of the display device according to one or more embodiments of the present disclosure.

FIG. 2 is a cross-sectional view of the display device DD according to one or more embodiments of the present disclosure.

The display device DD may include a display module DM and a window WM arranged on the display module DM. The display module DM and the window WM may be coupled by an adhesive layer PSA. According to one or more embodiments of the present disclosure, the window WM may be formed by a coating method and may contact the display module DM. In one or more embodiments, the adhesive layer PSA may not be provided.

The display module DM may include a display panel 100, an input sensor 200, and an anti-reflective layer 300. The display panel 100 may include a base layer 110, a driving element layer 120, a light emitting element layer 130, and an encapsulation layer 140.

The driving element layer 120 is arranged on the upper surface of the base layer 110. The base layer 110 may be a flexible substrate that is able to be bent, folded, or rolled. The base layer 110 may be a glass substrate, a metal substrate, or a polymer substrate. However, embodiments of the present disclosure are not limited thereto, and the base layer 110 may be an inorganic layer, an organic layer, or a composite layer. The base layer 110 has substantially the same shape as the display panel 100.

The base layer 110 may have a multi-layer structure. For example, the base layer 110 may include a first synthetic resin layer, a second synthetic resin layer, and inorganic layers arranged therebetween. Each of the first and second synthetic resin layers may include a polyimide-based resin, but is not limited thereto.

The driving element layer 120 may be arranged on the base layer 110. The driving element layer 120 may include a plurality of insulating layers, a plurality of semiconductor patterns, a plurality of conductive patterns, and signal lines. The driving element layer 120 may include a pixel driving circuit.

The light emitting element layer 130 may be arranged on the driving element layer 120. The light emitting element layer 130 may include a light emitting element. For example, the light emitting element may include an organic luminescent material, an inorganic luminescent material, an organic-inorganic luminescent material, a quantum dot, a quantum rod, a micro-LED, or a nano-LED.

The encapsulation layer 140 may be arranged on the light emitting element layer 130. The encapsulation layer 140 may protect the light emitting element layer 130, for example, the light emitting element in the light emitting element layer 130, from foreign matter such as moisture, oxygen, and dust particles. The encapsulation layer 140 may include at least one inorganic encapsulation layer. The encapsulation layer 140 may include a stack structure of a first inorganic encapsulation layer/an organic encapsulation layer/a second inorganic encapsulation layer.

The input sensor 200 may be directly arranged on the display panel 100. The input sensor 200 may sense a user input using, for example, an electromagnetic induction method and/or a capacitance method. The display panel 100 and the input sensor 200 may be formed through a substantially continuous process. The expression "directly arranged" used herein may refer to that a third component is not arranged between the input sensor 200 and the display panel 100. For example, a separate adhesive layer might not be between the input sensor 200 and the display panel 100.

The anti-reflective layer 300 decreases the reflectivity of external light incident from above the window WM. The anti-reflective layer 300 according to one or more embodiments of the present disclosure may include a phase retarder and a polarizer. The phase retarder may include (e.g., may be of) a film type or kind or a liquid-crystal coating type or kind and may include a λ/2 phase retarder and/or a λ/4 phase retarder. The polarizer may also include (e.g., may be of) a film type or kind or a liquid-crystal coating type or kind. The polarizer of a film type or kind may include a stretchable synthetic resin film, and the polarizer of a liquid-crystal coating type or kind may include liquid crystals arranged in a certain arrangement. The phase retarder and the polarizer may further include a protective film. The phase retarder and the polarizer themselves or the protective film may be defined as a base layer of the anti-reflective layer 300.

The anti-reflective layer 300 according to one or more embodiments of the present disclosure may include color filters. The color filters have a certain arrangement. The arrangement of a plurality of groups of color filters distinguished depending on colors may be determined in consideration of the arrangement of a plurality of groups of pixels distinguished depending on emission colors. The anti-reflective layer 300 may further include a black matrix adjacent to the color filters. The anti-reflective layer 300 including the color filters may be directly arranged on the display panel 100.

The window WM according to one or more embodiments of the present disclosure may include a base layer and a light blocking pattern. The base layer may include a glass substrate and/or a synthetic resin film. The light blocking pattern partially overlaps the base layer. The light blocking pattern may be arranged on the rear surface (e.g., lower surface) of the base layer. The light blocking pattern may substantially define the bezel area DD-NDA (refer to FIG. 1) of the display device DD. The area where the light blocking pattern is not arranged may define the image area DD-DA (refer to FIG. 1) of the display device DD.

Figure 3:
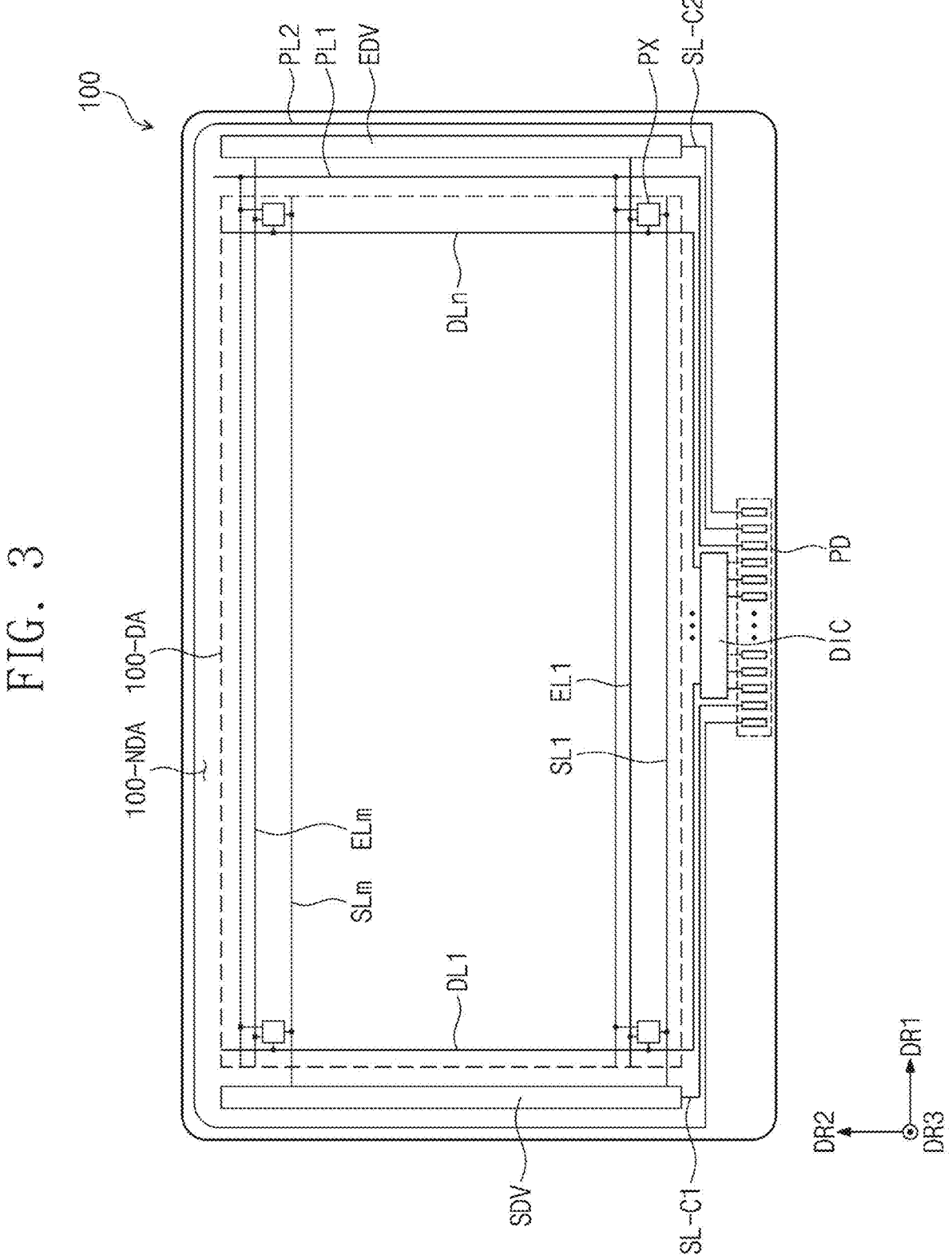
FIG. 3 is a plan view of a display panel according to one or more embodiments of the present disclosure.

FIG. 3 is a plan view of the display panel 100 according to one or more embodiments of the present disclosure.

Referring to FIG. 3, the display panel 100 may include a plurality of pixels PX, a scan drive circuit SDV, an emission drive circuit EDV, a plurality of signal lines, and a plurality of pads PD. The plurality of pixels PX are arranged in a display area 100-DA. A driver IC DIC mounted on a non-display area 100-NDA may include a data drive circuit. The display area 100-DA may correspond to the image area DD-DA of FIG. 1, and the non-display area 100-NDA may correspond to the bezel area DD-NDA. The expression "one area or portion corresponds to another area or portion" used herein refers to that the areas or portions overlap each other and does not necessarily refer to that the two different areas or portions have the same shape and area. In one or more embodiments of the present disclosure, likewise to the scan drive circuit SDV and the emission drive circuit EDV, the data drive circuit may also be integrated into the display panel 100.

The plurality of signal lines may include a plurality of scan lines SL1 to SLm, a plurality of data lines DL1 to DLn, a plurality of emission lines EL1 to ELm, first and second control lines SL-C1 and SL-C2, and first and second power lines PL1 and PL2. "m" and "n" are natural numbers of 2 or more.

The scan lines SL1 to SLm may extend in the first direction DR1 and may be electrically connected to the pixels PX and the scan drive circuit SDV. The data lines DL1 to DLn may extend in the second direction DR2 and may be electrically connected to the pixels PX and the driver IC DIC. The emission lines EL1 to ELm may extend in the first direction DR1 and may be electrically connected to the pixels PX and the emission drive circuit EDV. That is, the data lines DL1 to DLn and the emission lines EL1 to ELm may be further extended in directions substantially perpendicular to each other.

The first power line PL1 receives a first power voltage, and the second power line PL2 receives a second power voltage having a lower level than the first power voltage. In one or more embodiments, a second electrode (e.g., a cathode) of a light emitting element is electrically connected to the second power line PL2.

The first control line SL-C1 may be connected to the scan drive circuit SDV and may extend in a direction toward the lower end of the display panel 100. The second control line SL-C2 may be connected to the emission drive circuit EDV and may extend in a direction toward the lower end of the display panel 100. The pads PD may be arranged on the non-display area 100-NDA adjacent to the lower end of the display panel 100 and may be closer to the lower end of the display panel 100 than the driver IC DIC. That is, a distance between the pads PD and the lower end of the display panel 100 is less than a distance between the driver IC DIC and the lower end of the display panel 100. The pads PD may be connected to the driver IC DIC and some of the signal lines.

The scan drive circuit SDV may generate a plurality of scan signals, and the scan signals may be applied to the pixels PX through the scan lines SL1 to SLm. The driver IC DIC may generate a plurality of data voltages, and the data voltages may be applied to the pixels PX through the data lines DL1 to DLn. The emission drive circuit EDV may generate a plurality of emission signals, and the emission signals may be applied to the pixels PX through the emission lines EL1 to ELm. The pixels PX may receive the data voltages in response to the scan signals. The pixels PX may display an image by emitting light having luminance corresponding to the data voltages in response to the emission signals.

Figure 4A:
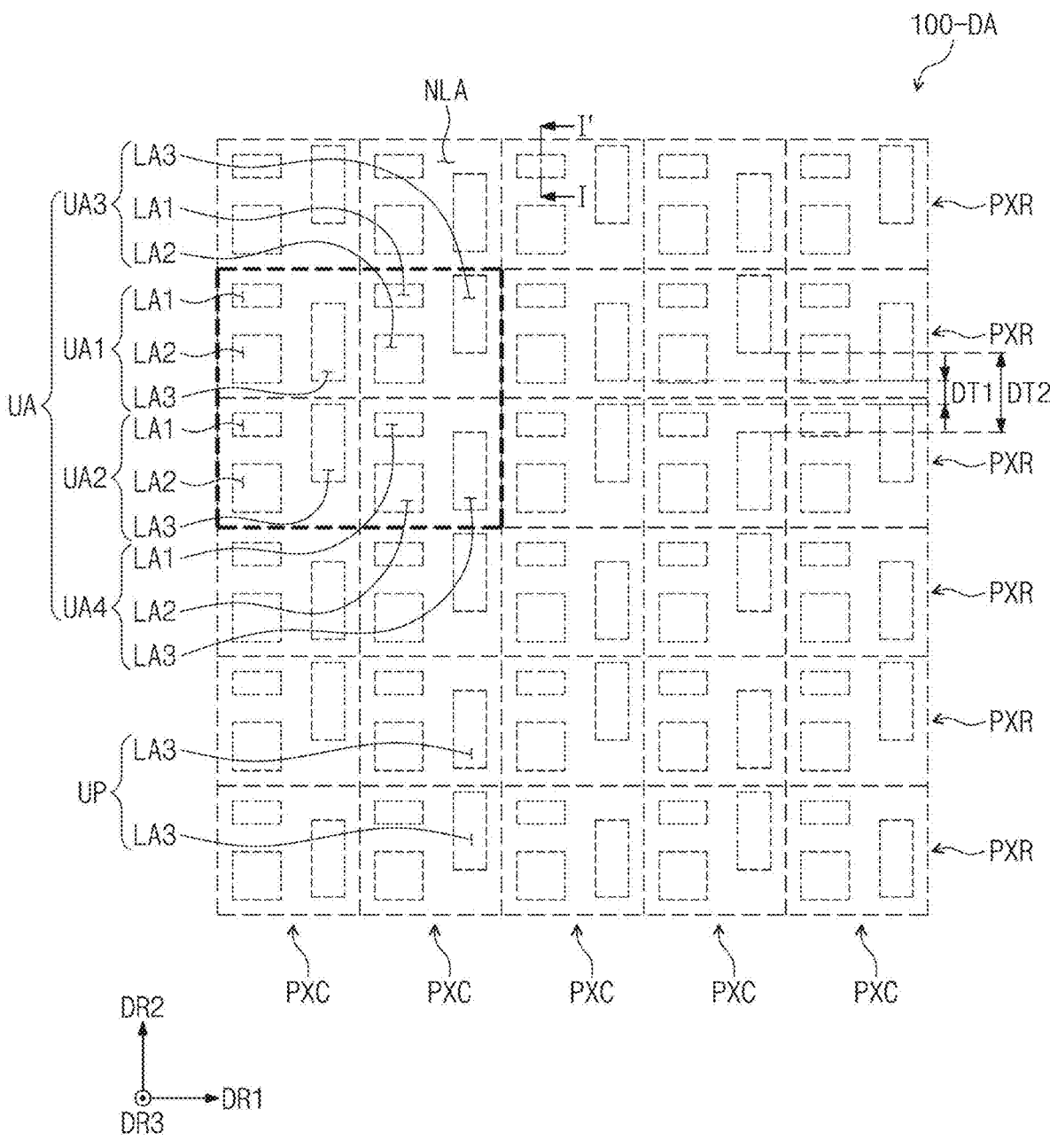
FIGS. 4A and 4B are enlarged plan views of a display area according to one or more embodiments of the present disclosure.
Figure 4B:
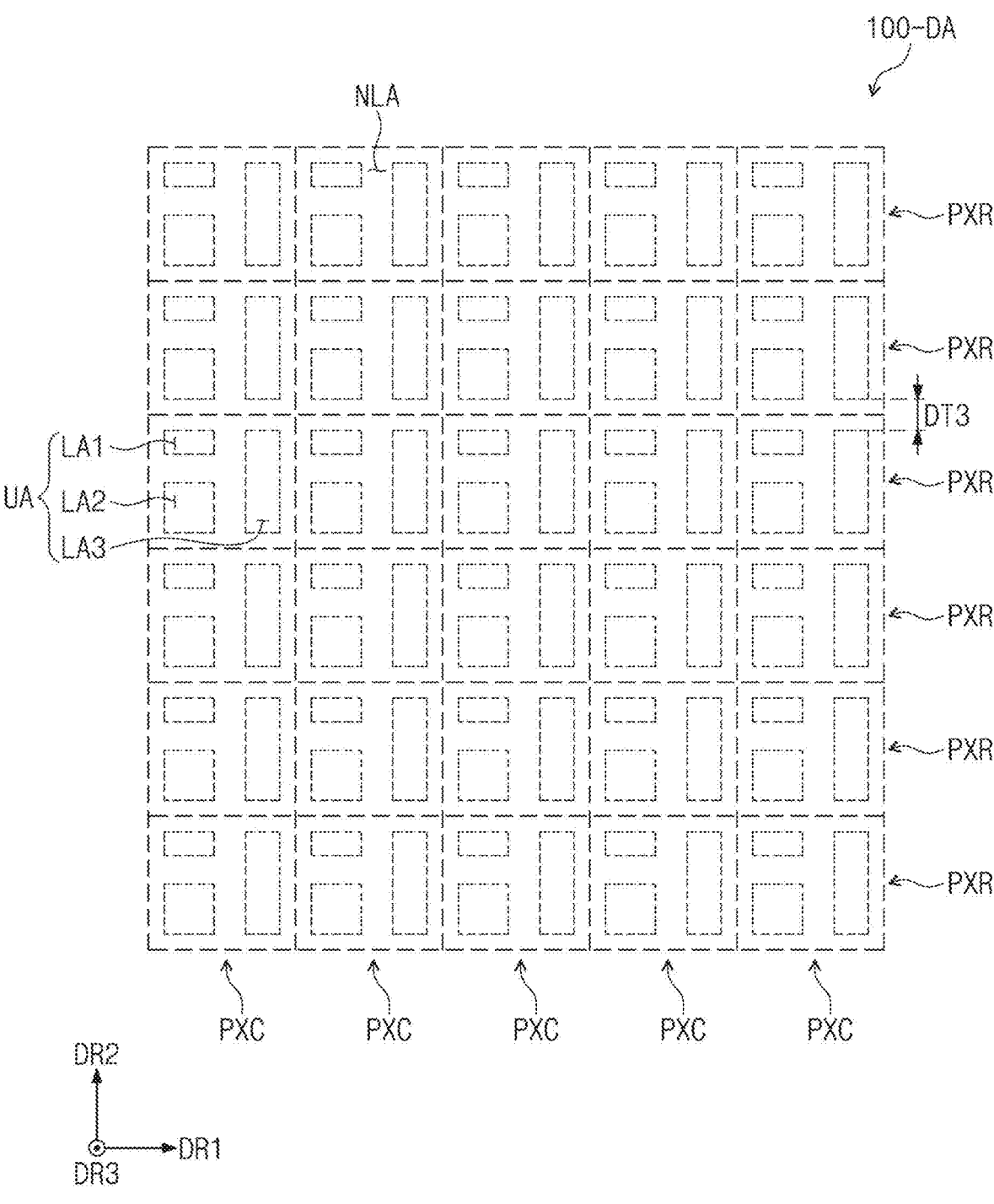

FIGS. 4A and 4B are enlarged plan views of the display area 100-DA according to one or more embodiments of the present disclosure.

Referring to FIG. 4A, the display area 100-DA may include a plurality of light emitting areas LA1, LA2, and LA3 and a non-light emitting area NLA adjacent to the plurality of light emitting areas LA1, LA2, and LA3. The non-light emitting area NLA sets the boundaries between the light emitting areas LA1, LA2, and LA3. That is, the light emitting areas LA1, LA2, and LA3 are spaced (e.g., spaced apart) from each other by the non-light emitting area NLA.

The light emitting areas LA1, LA2, and LA3 may be arranged to correspond to the pixels PX of FIG. 3 in a one-to-one manner. The pixels PX may include light emitting elements, respectively, and the light emitting areas LA1, LA2, and LA3 may be areas through which light formed by the light emitting elements is emitted. An arrangement relationship between the light emitting areas LA1, LA2, and LA3 and the non-light emitting area NLA will be described in more detail with reference to FIG. 5.

The light emitting areas LA1, LA2, and LA3 may be divided into a plurality of groups distinguished depending on emission colors. The light emitting areas LA1, LA2, and LA3 may include first color light emitting areas LA1 (or, first light emitting areas) that form light of a first color, second color light emitting areas LA2 (or, second light emitting areas) that form light of a second color, and third color light emitting areas LA3 (or, third light emitting areas) that form light of a third color. In this embodiment, the light of the first color may be red light, the light of the second color may be green light, and the light of the third color may be blue light.

The first color light emitting areas LA1, the second color light emitting areas LA2, and the third color light emitting areas LA3 may have different areas from each other, but are not necessarily limited thereto. In this embodiment, the first color light emitting areas LA1 may have the smallest area, and the third color light emitting areas LA3 may have the largest area.

The first color light emitting areas LA1, the second color light emitting areas LA2, and the third color light emitting areas LA3 may be arranged according to a set or predetermined rule. A unit area UA is a repetitive arrangement unit of the first to third color light emitting areas LA1, LA2, and LA3 arranged in the display area 100-DA. In this embodiment, the unit area UA may include a first sub-area UA1, a second sub-area UA2, a third sub-area UA3, and a fourth sub-area UA4.

A plurality of unit areas UA are arranged in the display area 100-DA. The plurality of unit areas UA may be arranged in a matrix form. The following description will be focused on one unit area UA, and each of the plurality of unit areas UA may include the first to fourth sub-areas UA1 to UA4 having the same arrangement as those of the one unit area UA to be described in more detail herein.

Each of the first sub-area UA1, the second sub-area UA2, the third sub-area UA3, and the fourth sub-area UA4 includes the first color light emitting area LA1, the second color light emitting area LA2, and the third color light emitting area LA3. In each of the first sub-area UA1, the second sub-area UA2, the third sub-area UA3, and the fourth sub-area UA4, the arrangement of the first color light emitting area LA1 and the second color light emitting area LA2 relative to the third color light emitting area LA3 may be substantially the same as will be described in more detail.

In each of the first sub-area UA1, the second sub-area UA2, the third sub-area UA3, and the fourth sub-area UA4, the third color light emitting area LA3 is arranged on a (e.g., one) side in the first direction DR1 from the first color light emitting area LA1 and the second color light emitting area LA2 (i.e., the direction which is from the first color light-emitting area LA1 and the second color light-emitting area LA2). As illustrated in FIG. 4A, the third color light emitting area LA3 may be arranged on the right side of the first color light emitting area LA1 and the second color light emitting area LA2.

In each of the first sub-area UA1, the second sub-area UA2, the third sub-area UA3, and the fourth sub-area UA4, the first color light emitting area LA1 may be aligned with the second color light emitting area LA2 in the second direction DR2. For example, the center point of the first color light emitting area LA1 and the center point of the second color light emitting area LA2 may be located on a virtual line being further extended (e.g., extending) in the second direction DR2. That is, the center point of the first color light emitting area LA1 overlaps the center point of the second color light emitting area LA in the second direction DR2.

The first sub-area UA1 and the second sub-area UA2 may be aligned with each other in the second direction DR2, and the third sub-area UA3 and the fourth sub-area UA4 may be aligned with each other in the second direction DR2. The third sub-area UA3 is arranged on one side of the first sub-area UA1 in the first direction DR1 (on the right side in FIG. 4A), and the fourth sub-area UA4 is arranged on one side of the second sub-area UA2 in the first direction DR1 (on the right side in FIG. 4A).

The first sub-area UA1 and the second sub-area UA2 are different from each other in terms of the position of the third color light emitting area LA3 relative to the first color light emitting area LA1 and the second color light emitting area LA2 in the second direction DR2. Referring to the first sub-area UA1, the third color light emitting area LA3 is arranged on a lower side relative to the first color light emitting area LA1 and the second color light emitting area LA2 in the second direction DR2. Referring to the second sub-area UA2, the third color light emitting area LA3 is arranged on an upper side relative to the first color light emitting area LA1 and the second color light emitting area LA2 in the second direction DR2. The first sub-area UA1 and the second sub-area UA2 may be different from each other in terms of the degree to which the third color light emitting area LA3 is shifted relative to the first color light emitting area LA1 and the second color light emitting area LA2 in the second direction DR2. In this embodiment, the third color light emitting area LA3 of the second sub-area UA2 may be further shifted if (e.g., when) compared to the third color light emitting area LA3 of the first sub-area UA1. However, without being limited thereto, the first sub-area UA1 and the second sub-area UA2 may be the same as each other in terms of the degree to which the third color light emitting area LA3 is shifted relative to the first color light emitting area LA1 and the second color light emitting area LA2 in the second direction DR2.

In this embodiment, the arrangement of the first to third color light emitting areas LA1 to LA3 in the third sub-area UA3 may be substantially the same as that in the second sub-area UA2, and the arrangement of the first to third color light emitting areas LA1 to LA3 in the fourth sub-area UA4 may be substantially the same as that in the first sub-area UA1. The first sub-area UA1 and the fourth sub-area UA4 may be the same as each other in terms of the degree to which the third color light emitting area LA3 is shifted relative to the first color light emitting area LA1 and the second color light emitting area LA2 in the second direction DR2. The second sub-area UA2 and the third sub-area UA3 may be the same as each other in terms of the degree to which the third color light emitting area LA3 is shifted relative to the first color light emitting area LA1 and the second color light emitting area LA2 in the second direction DR2.

The third color light emitting area LA3 of the first sub-area UA1 and the third color light emitting area LA3 of the second sub-area UA2 in the unit area UA may be spaced and/or apart (e.g., spaced apart or separated) from each other by a first gap DT1 and may be arranged relatively close to each other. The third color light emitting area LA3 of the first sub-area UA1 and the third color light emitting area LA3 of the second sub-area UA2 spaced and/or apart (e.g., spaced apart or separated) from each other by the first gap DT1 define a light emitting area pair UP in the unit area UA.

The third color light emitting area LA3 of the third sub-area UA3 and the third color light emitting area LA3 of the fourth sub-area UA4 in the unit area UA may be spaced and/or apart (e.g., spaced apart or separated) from each other by a second gap DT2 and may be arranged relatively far away from each other. The second gap DT2 is greater than the first gap DT1.

The third color light emitting area LA3 of the third sub-area UA3 in one unit area UA may define a light emitting area pair UP with the third color light emitting area LA3 of the fourth sub-area UA4 in another unit area UA arranged in another pixel row PXR and the same pixel column PXC. As illustrated in FIG. 4A, the third color light emitting area LA3 of the third sub-area UA3 in one unit area UA may define a light emitting area pair UP with the third color light emitting area LA3 of the fourth sub-area UA4 in another unit area UA arranged on the upper side. The third color light emitting area LA3 of the fourth sub-area UA4 in one unit area UA may define a light emitting area pair UP with the third color light emitting area LA3 of the third sub-area UA3 in another unit area UA arranged in another pixel row PXR and the same pixel column PXC. As illustrated in FIG. 4A, the third color light emitting area LA3 of the fourth sub-area UA4 in one unit area UA may define a light emitting area pair UP with the third color light emitting area LA3 of the third sub-area UA3 in another unit area UA arranged on the lower side.

The reason why the light emitting area pairs UP are defined as described above is because the sub-areas UA1 to UA4 are differently arranged depending on the pixel rows PXR. This is because if (e.g., when) the first sub-areas UA1 and the third sub-areas UA3 are arranged to alternate with one another in the first direction DR1 in the odd-numbered pixel rows PXR, the second sub-areas UA2 and the fourth sub-areas UA4 are arranged to alternate with one another in the first direction DR1 in the even-numbered pixel rows PXR.

The reason for forming the light emitting area pairs UP is because of a mask used for deposition. The deposition mask is used to form a light emitting layer having a one-body shape in the light emitting element arranged in the third color light emitting area LA3 of the first sub-area UA1 and the light emitting element arranged in the third color light emitting area LA3 of the second sub-area UA2. For example, the light emitting layer arranged in the third color light emitting area LA3 of the first sub-area UA1 and the light emitting layer arranged in the third color light emitting area LA3 of the second sub-area UA2 have a one-body shape. Openings corresponding to the light emitting area pairs UP are defined in the deposition mask. The areas between the openings of the deposition mask correspond to blocking areas of the deposition mask. Because the openings corresponding to the light emitting area pairs UP are defined, the number of openings may be decreased, and the widths of the blocking areas of the deposition mask arranged between the openings in the second direction DR2 may be secured. For the thin deposition mask, the widths of the blocking areas in the second direction DR2 have to be secured to suppress or reduce a defect in which the deposition mask sags in the deposition process. In one or more embodiments, a mask having a small number of openings may be easy to produce, and a mask defect may be reduced.

This can be seen by comparing the third gap DT3 between the third color light emitting areas LA3 illustrated in FIG. 4B with the second gap DT2 in FIG. 4B. Referring to FIG. 4B, one type or kind of unit area UA is arranged in the display area 100-DA. The third gap DT3 between the third color light emitting areas LA3 of adjacent unit areas UA in the pixel column PXC is smaller than the second gap DT2 in FIG. 4B. Because openings are arranged for the respective third color light emitting areas LA3, a deposition mask used to form the third color light emitting areas LA3 of FIG. 4B includes a larger number of openings than the deposition mask described with reference to FIG. 4A. Accordingly, the widths of blocking areas of the deposition mask having a larger number of openings are relatively decreased. This is because the openings corresponding to the third color light emitting areas LA3, respectively, are defined in the mask used to form light emitting layers in the third color light emitting areas LA3 illustrated in FIG. 4B.

Figure 5:
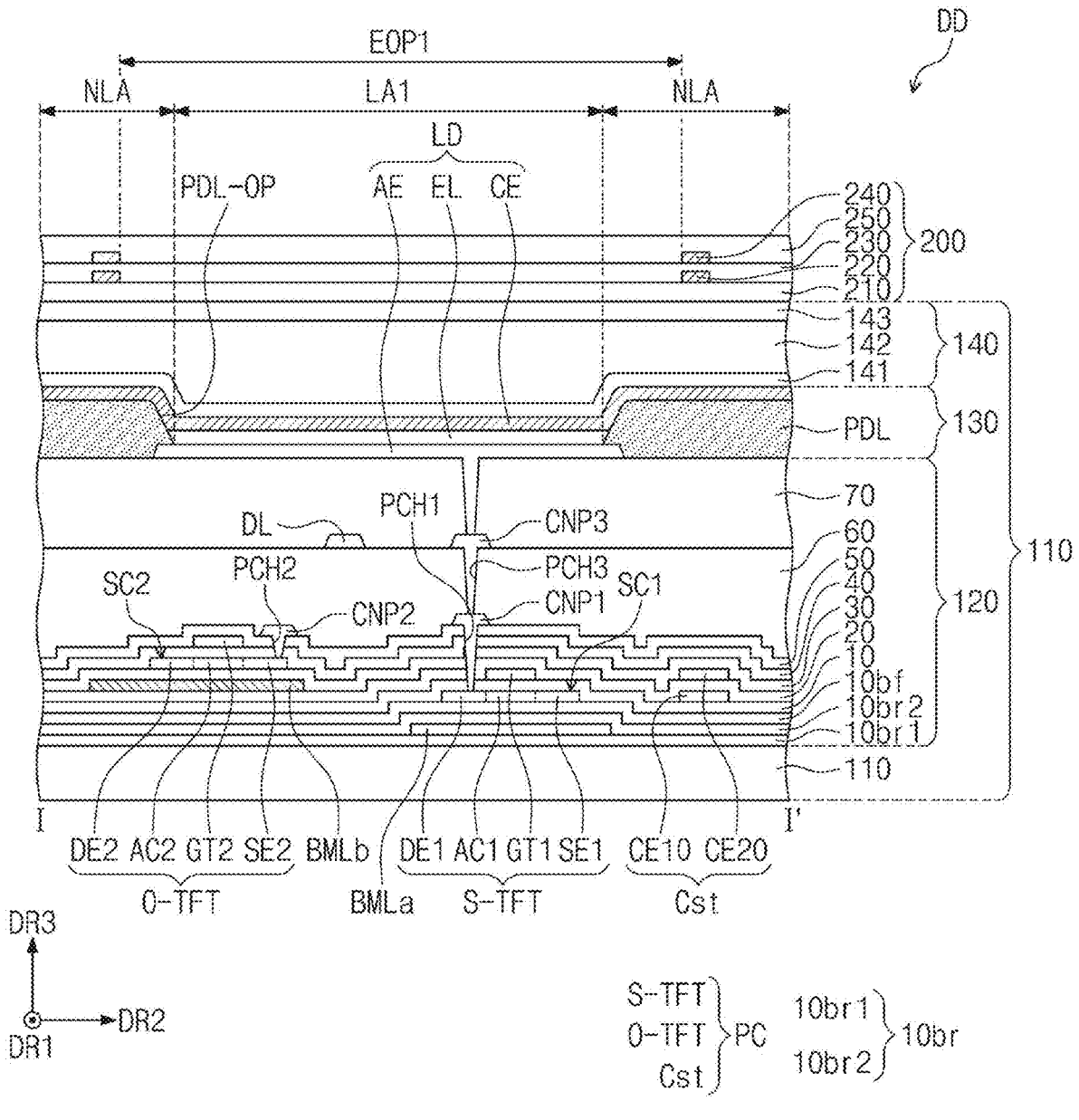
FIG. 5 is a cross-sectional view of the display device corresponding to line I-I' illustrated in FIG. 4A.

FIG. 5 is a cross-sectional view of the display device DD corresponding to line I-I' illustrated in FIG. 4A. Some of the components of the display device DD, for example, the anti-reflective layer 300 and the window WM in FIG. 2 are not illustrated in FIG. 5.

A pixel driving circuit PC that drives a light emitting element LD may include a plurality of pixel driving elements. The pixel driving circuit PC may include a plurality of transistors and a capacitor Cst. In FIG. 5, a silicon transistor S-TFT and an oxide transistor O-TFT are illustrated as examples of the transistors. The pixel driving circuit PC of FIG. 5 is an only an example, and the configuration of the pixel driving circuit PC is not necessarily limited thereto. The pixel driving circuit PC may include only one of the silicon transistor S-TFT and the oxide transistor O-TFT.

Referring to FIG. 5, the base layer 110 is illustrated as a single layer. The base layer 110 may include a synthetic resin such as polyimide. The base layer 110 may be formed by coating a working substrate (or, a carrier substrate) with a synthetic resin. The working substrate may be removed after the display module DM is completed by performing subsequent processes. In one or more embodiments of the present disclosure, the base layer 110 may have a multi-layer structure that includes a first synthetic resin layer, at least one inorganic layer, and a second synthetic resin layer.

Referring to FIG. 5, a barrier layer 10br may be arranged on the base layer 110. The barrier layer 10br prevents infiltration of foreign matter from the outside. The barrier layer 10br may include at least one inorganic layer. The barrier layer 10br may include a silicon oxide layer and a silicon nitride layer. A plurality of silicon oxide layers and a plurality of silicon nitride layers may be provided. The silicon oxide layers and the silicon nitride layers may be alternately stacked one above another.

The barrier layer 10br may include a lower barrier layer 10br1 and an upper barrier layer 10br2. A first shielding electrode BMLa may be arranged between the lower barrier layer 10br1 and the upper barrier layer 10br2. The first shielding electrode BMLa may be arranged to correspond to the silicon transistor S-TFT. The first shielding electrode BMLa may include metal, for example, molybdenum. The first shielding electrode BMLa may receive a bias voltage.

A buffer layer 10bf may be arranged on the barrier layer 10br. The buffer layer 10bf may prevent or reduce diffusion of metal atoms or impurities from the base layer 110 to a first semiconductor pattern SCP1 arranged over the base layer 110. The buffer layer 10bf may include at least one inorganic layer. The buffer layer 10bf may include a silicon oxide layer and a silicon nitride layer.

The first semiconductor pattern SC1 may be arranged on the buffer layer 10bf. The first semiconductor pattern SC1 may include a silicon semiconductor. For example, the silicon semiconductor may include amorphous silicon or polycrystalline silicon. For example, the first semiconductor pattern SC1 may include low-temperature polycrystalline silicon.

The first semiconductor pattern SC1 may have different electrical properties depending on whether doping is performed or not. The first semiconductor pattern SC1 may include first areas having a high conductivity and a second area having a low conductivity. The first areas may be doped with an N-type (kind) dopant or a P-type (kind) dopant. The second area may be a non-doped area (e.g., does not include a dopant) or may be an area more lightly doped than the first areas (e.g., may include a lower content of dopant than the first areas). A source area SE1, a channel area (or, an active area) AC1, and a drain area DE1 of the silicon transistor S-TFT may be formed from the first semiconductor pattern SC1. The source area SE1 and the drain area DE1 may extend from the channel area AC1 in opposite directions on the section.

A first insulating layer 10 may be arranged on the buffer layer 10bf. The first insulating layer 10 may cover the first semiconductor pattern SC1. The first insulating layer 10 may be an inorganic layer. Not only the first insulating layer 10 but also inorganic layers of the driving element layer 120 that will be described in more detail herein may have a single-layer structure or a multi-layer structure and may include at least one of the above-described materials, but are not limited thereto.

A gate GT1 of the silicon transistor S-TFT may be arranged on the first insulating layer 10. The gate GT1 may be a portion of a metal pattern. The gate GT1 overlaps the channel area AC1 in the third direction DR3 (e.g., from above). The gate GT1 may serve as a mask in a process of doping the first semiconductor pattern SC1. A first electrode CE10 of the storage capacitor Cst may be arranged on the first insulating layer 10. The first electrode CE10 may have a one-body shape with the gate GT1 if (e.g., when) viewed from above the plane.

A second insulating layer 20 may be arranged on the first insulating layer 10 and may cover the gate GT1. In one or more embodiments of the present disclosure, an upper electrode overlapping the gate GT1 in the third direction DR3 may be additionally arranged on the second insulating layer 20. A second electrode CE20 overlapping the first electrode CE10 in the third direction DR3 may be arranged on the second insulating layer 20. The upper electrode may have a one-body shape with the second electrode CE20 if (e.g., when) viewed from above the plane (e.g., in the plan view).

A second shielding electrode BMLb is arranged on the second insulating layer 20. The second shielding electrode BMLb may be arranged to correspond to the oxide transistor O-TFT. In one or more embodiments of the present disclosure, the second shielding electrode BMLb may not be provided. A third insulating layer 30 may be arranged on the second insulating layer 20. A second semiconductor pattern SC2 may be arranged on the third insulating layer 30. The second semiconductor pattern SC2 may include a channel area AC2 of the oxide transistor O-TFT. The second semiconductor pattern SC2 may include a metal oxide semiconductor. The second semiconductor pattern SC2 may include transparent conductive oxide (TCO) such as indium tin oxide (ITO), indium zinc oxide (IZO), indium gallium zinc oxide (IGZO), zinc oxide (ZnOx), or indium oxide (In$_2$O$_3$).

The metal oxide semiconductor may include a plurality of areas SE2, AC2, and DE2 distinguished from each other depending on whether the transparent conductive oxide is reduced. The area where the transparent conductive oxide is reduced (hereinafter, referred to as the reduced area) has a higher conductivity than the area where the transparent conductive oxide is not reduced (hereinafter, referred to as the non-reduced area). The reduced area substantially serves as a source/drain of the transistor or a signal line. The non-reduced area substantially corresponds to a semiconductor area (or, a channel) of the transistor. A fourth insulating layer 40 may be arranged on the third insulating layer 30. As illustrated in FIG. 5, the fourth insulating layer 40 may cover the second semiconductor pattern SC2.

A gate GT2 of the oxide transistor O-TFT is arranged on the fourth insulating layer 40. The gate GT2 of the oxide transistor O-TFT may be a portion of a metal pattern. The gate GT2 of the oxide transistor O-TFT may overlap the channel area AC2 in the third direction DR3. A fifth insulating layer 50 may be arranged on the fourth insulating layer 40 and may cover the gate GT2. Each of the first to fifth insulating layers 10, 20, 30, 40, and 50 may be an inorganic layer.

A first connecting pattern CNP1 and a second connecting pattern CNP2 may be arranged on the fifth insulating layer 50. Because the first connecting pattern CNP1 and the second connecting pattern CNP2 are formed through substantially the same process, the first connecting pattern CNP1 and the second connecting pattern CNP2 may have the same material and the same stack structure. The first connecting pattern CNP1 may be connected to the drain area DE1 of the silicon transistor S-TFT through a first pixel contact hole PCH1 penetrating the first to fifth insulating layers 10, 20, 30, 40, and 50. The second connecting pattern CNP2 may be connected to the source area SE2 of the oxide transistor O-TFT through a second pixel contact hole PCH2 penetrating the fourth and fifth insulating layers 40 and 50. The connection relationship between the silicon transistor S-TFT and the first connecting pattern CNP1 and the connection relationship between the oxide transistor O-TFT and the second connecting pattern CNP2 are not necessarily limited thereto.

A sixth insulating layer 60 may be arranged on the fifth insulating layer 50. A third connecting pattern CNP3 may be arranged on the sixth insulating layer 60. The third connecting pattern CNP3 may be connected to the first connecting pattern CNP1 through a third pixel contact hole PCH3 penetrating the sixth insulating layer 60. A data line DL may be arranged on the sixth insulating layer 60. A seventh insulating layer 70 may be arranged on the sixth insulating layer 60 and may cover the third connecting pattern CNP3 and the data line DL. Because the third connecting pattern CNP3 and the data line DL are formed through substantially the same process, the third connecting pattern CNP3 and the data line DL may have the same material and the same stack structure. Each of the sixth insulating layer 60 and the seventh insulating layer 70 may be an organic layer.

The light emitting element LD may include an anode AE (or, a first electrode), a light emitting layer EL, and a cathode CE (or, a second electrode). The anode AE of the light emitting element LD may be arranged on the seventh insulating layer 70. The anode AE may be a (semi-) transmissive electrode or a reflective electrode. The anode AE may include a stack structure of ITO/Ag/ITO sequentially stacked one above another. The positions of the anode AE and the cathode CE may be interchanged.

A pixel defining layer PDL may be arranged on the seventh insulating layer 70. The pixel defining layer PDL may be an organic layer. The pixel defining layer PDL may have a property of absorbing light. For example, the pixel defining layer PDL may be black in color. The pixel defining layer PDL may include a black coloring agent. The black coloring agent may include a black dye or a black pigment. The black coloring agent may include a metal such as chromium, oxide thereof, or carbon black. The pixel defining layer PDL may correspond to a light blocking pattern having light blocking characteristics.

The pixel defining layer PDL may cover a portion of the anode AE. For example, an opening PDL-OP for exposing a portion of the anode AE may be defined in the pixel defining layer PDL. A light emitting area LA1 may be defined to correspond to the opening PDL-OP. In FIG. 5, one light emitting area LA1 corresponding to the first color light emitting area LA1 of FIG. 4A is illustrated. The sections corresponding to the second color light emitting area LA2 and the third color light emitting area LA3 of FIG. 4A may also be substantially the same as that in FIG. 5. However, light emitting layers EL including materials different from that of the first color light emitting area LA1 may be arranged in the second color light emitting area LA2 and the third color light emitting area LA3. In one or more embodiments, referring to the light emitting area pair UP of FIG. 4A, the pixel defining layer PDL is arranged between the third color light emitting area LA3 of the first sub-area UA1 and the third color light emitting area LA3 of the second sub-area UA2. The light emitting layers EL arranged in the third color light emitting area LA3 of the first sub-area UA1 and the third color light emitting area LA3 of the second sub-area UA2 may be arranged on the pixel defining layer PDL arranged between the third color light emitting area LA3 of the first sub-area UA1 and the third color light emitting area LA3 of the second sub-area UA2.

In one or more embodiments of the present disclosure, a hole control layer may be arranged between the anode AE and the light emitting layer EL. The hole control layer may include a hole transport layer and may further include a hole injection layer. An electron control layer may be arranged between the light emitting layer EL and the cathode CE. The electron control layer may include an electron transport layer and may further include an electron injection layer.

The encapsulation layer 140 may cover the light emitting element LD. The encapsulation layer 140 may include an inorganic encapsulation layer 141, an organic encapsulation layer 142, and an inorganic encapsulation layer 143 sequentially stacked one above another. However, layers constituting the encapsulation layer 140 are not necessarily limited thereto. The inorganic encapsulation layers 141 and 143 may include a silicon nitride layer, a silicon oxy nitride layer, a silicon oxide layer, a titanium oxide layer, or an aluminum oxide layer. Each of the inorganic encapsulation layers 141 and 143 may have a multi-layer structure. The organic encapsulation layer 142 may include an acrylic organic layer, but the present disclosure is not limited thereto.

In this embodiment, the input sensor 200 may include at least one conductive layer (or, at least one sensor conductive layer) and at least one insulating layer (or, at least one sensor insulating layer). In this embodiment, the input sensor 200 may include a first insulating layer 210 (or, a first sensor insulating layer), a first conductive layer 220 (or, a first sensor conductive layer), a second insulating layer 230 (or, a second sensor insulating layer), a second conductive layer 240 (or, a second sensor conductive layer), and a third insulating layer 250 (or, a third sensor insulating layer). In FIG. 5, line elements of the first conductive layer 220 and line elements of the second conductive layer 240 are briefly illustrated.

The first insulating layer 210 may be directly arranged on the display panel 100. The first insulating layer 210 may be an inorganic layer including at least one of silicon nitride, silicon oxy nitride, or silicon oxide. Each of the first conductive layer 220 and the second conductive layer 240 may have a single-layer structure or may have a multi-layer structure stacked in the third direction DR3. The first conductive layer 220 and the second conductive layer 240 may include line elements that define electrodes having a mesh shape. The line elements of the first conductive layer 220 and the line elements of the second conductive layer 240 may be connected through contact holes penetrating the second insulating layer 230 depending on positions or may be not connected.

The first conductive layer 220 and the second conductive layer 240 that have a single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnOx), or indium zinc tin oxide (IZTO). In one or more embodiments, the transparent conductive layer may include a conductive polymer such as PEDOT, a metal nano-wire, or graphene.

The first conductive layer 220 and the second conductive layer 240 that have a multi-layer structure may include metal layers. The conductive layers having the multi-layer structure may include at least one metal layer and at least one transparent conductive layer. The second insulating layer 230 may be arranged between the first conductive layer 220 and the second conductive layer 240. The third insulating layer 250 may cover the second conductive layer 240. In one or more embodiments of the present disclosure, the third insulating layer 250 may not be provided. The second insulating layer 230 and the third insulating layer 250 may include an inorganic material or an organic material.

Figure 6A:
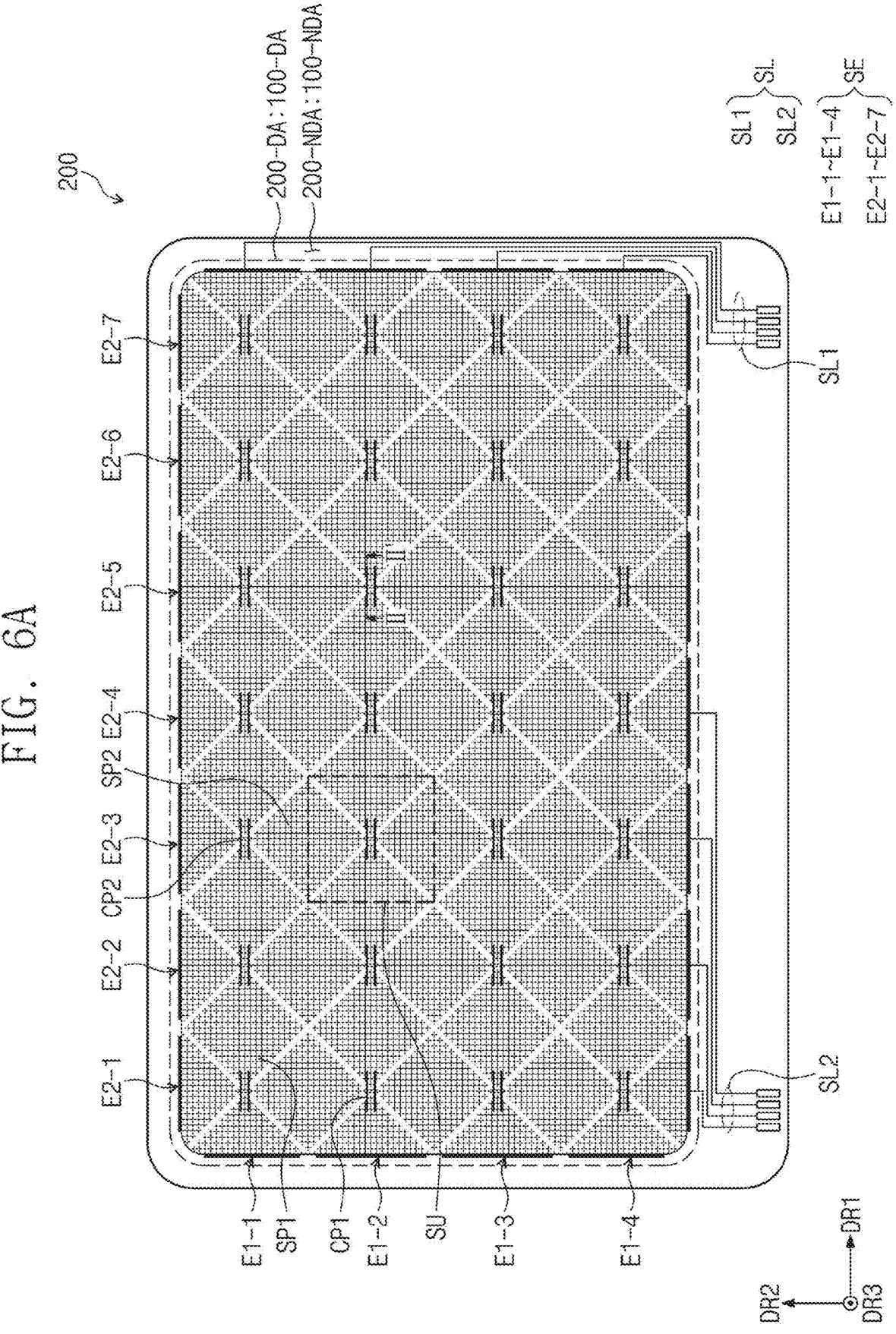
FIG. 6A is a plan view of an input sensor according to one or more embodiments of the present disclosure.
Figure 6B:
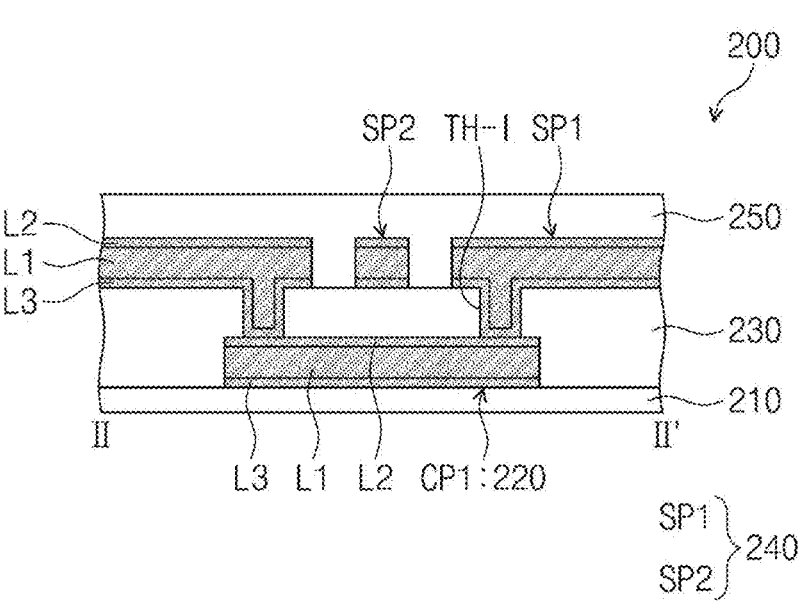
FIG. 6B is a cross-sectional view of the input sensor corresponding to line II-II' of FIG. 6A.

FIG. 6A is a plan view of the input sensor 200 according to one or more embodiments of the present disclosure. FIG. 6B is a cross-sectional view of the input sensor 200 corresponding to line II-II' of FIG. 6A.

As illustrated in FIG. 6A, the input sensor 200 includes a sensing area 200-DA and a non-sensing area 200-NDA adjacent to the sensing area 200-DA. The sensing area 200-DA and the non-sensing area 200-NDA correspond to the display area 100-DA and the non-display area 100-NDA, respectively, which are illustrated in FIG. 5. The input sensor 200 may include a sensing electrode SE and a signal line SL connected to the sensing electrode SE. In this embodiment, the sensing electrode SE may include first electrodes E1-1 to E1-4 (or, first sensing electrodes) and second electrodes E2-1 to E2-7 (or, second sensing electrodes), and the signal line SL may include first signal lines SL1 (or, first sensor signal lines) and second signal lines SL2 (or, second sensor signal lines).

The first electrodes E1-1 to E1-4 and the second electrodes E2-1 to E2-7 that cross each other while being insulated from each other are arranged in the sensing area 200-DA. The first signal lines SL1 electrically connected to the first electrodes E1-1 to E1-4 and the second signal lines SL2 electrically connected to the second electrodes E2-1 to E2-7 are arranged in the non-sensing area 200-NDA. One set of signal lines selected from either (1) the first signal lines SL1 or (2) the second signal lines SL2 transfers a driving signal for sensing an external input from an external circuit to corresponding electrodes while the other set (selected from either (1) the first signal lines SL1 or (2) the second signal lines SL2) outputs a sensing signal. A change in the capacitance between the first electrodes E1-1 to E1-4 and the second electrodes E2-1 to E2-7 is measured based on the sensing signal. In this embodiment, the input sensor of a mutual cap type or kind is illustrated as an example. However, the present disclosure is not limited thereto. A self-cap type or kind structure including one type or kind of sensing electrodes may be applied to the input sensor 200. In the above-described electrode structure, the input sensor 200 may be driven in a self-cap type or kind.

In this embodiment, four first electrodes E1-1 to E1-4 and seven second electrodes E2-1 to E2-7 are illustrated as examples. The four first electrodes E1-1 to E1-4 constitute different channels, and the seven second electrodes E2-1 to E2-7 constitute different channels. In this case, twenty-eight sensing units SU may be defined. An intersection area of a corresponding first electrode and a corresponding second electrode is arranged in each of the sensing units SU.

In one or more embodiments, according to one or more embodiments of the present disclosure, first electrodes may define a plurality of first channel groups, and each of the first channel groups may include two or more first electrodes. The two or more first electrodes belonging to the first channel group may receive the same signal or may be electrically connected with each other. The two or more first electrodes belonging to the first channel group may be connected to the same signal line. Second electrodes may define a plurality of second channel groups, and each of the second channel groups may include two or more second electrodes. The two or more second electrodes belonging to the second channel group may receive the same signal or may be electrically connected with each other. The two or more second electrodes belonging to the second channel group may be connected to the same signal line.

According to this embodiment, an intersection area of a corresponding first channel group and a corresponding second channel group may be arranged in each sensing unit SU. For example, assuming that twelve first electrodes define four first channel groups and twenty one second electrodes define seven second channel groups, twenty eight sensing units SU may be formed. The first channel group may include three first electrodes arranged in succession, and the second channel group may include three second electrodes arranged in succession. In this case, nine intersection areas of the first electrodes and the second electrodes are arranged in each sensing unit SU.

Referring again to FIG. 6A, each of the first electrodes E1-1 to E1-4 and the second electrodes E2-1 to E2-7 may have a mesh shape in which a plurality of opening areas are defined. Each of the first electrodes E1-1 to E1-4 and the second electrodes E2-1 to E2-7 includes line elements that define the plurality of opening areas. For example, each of the plurality of opening areas may overlap a corresponding light emitting area among the plurality of light emitting areas LA1, LA2, and LA3 of FIG. 4A.

One of the first electrodes E1-1 to E1-4 and the second electrodes E2-1 to E2-7 may have a one-body shape. In this embodiment, the second electrodes E2-1 to E2-7 having a one-body shape are illustrated as an example. The second electrodes E2-1 to E2-7 may include sensing parts SP2 and intermediate parts CP2. The sensing parts SP2 may have a larger area than the intermediate parts CP2 and may have a rhombic shape. Each of the intermediate parts CP2 is arranged between two sensing parts SP2 adjacent to each other among the sensing parts SP2. The intermediate part CP2 may be relatively short. The intermediate part CP2 may not be provided. In this case, one sensing part SP2 may be further extended (e.g., directly extend) from the other sensing part SP2 adjacent thereto.

Each of the first electrodes E1-1 to E1-4 may include sensing patterns SP1 and bridge patterns CP1 (or, connecting patterns). Two adjacent sensing patterns SP1 may be connected through two bridge patterns CP1. However, the number of bridge patterns is not limited thereto.

Referring to FIGS. 6A and 6B, the bridge patterns CP1 may be formed from the first conductive layer 220, and the plurality of first electrodes E1-1 to E1-4 and the plurality of sensing patterns SP1 may be formed from the second conductive layer 240. The bridge pattern CP1 may be connected to the sensing patterns SP1 through contact holes TH-I formed in the second insulating layer 230. However, the present disclosure is not limited thereto. In one or more embodiments of the present disclosure, the bridge patterns CP1 may be formed from the second conductive layer 240, and the plurality of second electrodes E2-1 to E2-7 and the plurality of sensing patterns SP1 may be formed from the first conductive layer 220.

Each of the first conductive layer 220 and the second conductive layer 240 includes a first metal layer L1 and a second metal layer L2 arranged on the first metal layer L1. The first metal layer L1 may have a higher electrical conductivity and a higher reflectivity than the second metal layer L2. Accordingly, the first metal layer L1 corresponds to a substantial signal path, and the second metal layer L2 reduces the reflectivity of the first conductive layer 220 and the second conductive layer 240. Each of the first conductive layer 220 and the second conductive layer 240 may include a third metal layer L3 arranged under the first metal layer L1. The third metal layer L3 may not be provided. The third metal layer L3 may be arranged to increase the adhesive force of the first conductive layer 220 and the second conductive layer 240 to the first insulating layer 210. Each of the first conductive layer 220 and the second conductive layer 240 may have a three-layer structure of titanium/aluminum/titanium.

In this embodiment, each of the first signal lines SL1 and the second signal lines SL2 of FIG. 6A may be formed from the first conductive layer 220 of FIG. 6B. Accordingly, each of the first signal lines SL1 and the second signal lines SL2 of FIG. 6A may be arranged on the same layer as the bridge pattern CP1 of FIG. 6B. However, without being limited thereto, each of the first signal lines SL1 and the second signal lines SL2 may be formed from the second conductive layer 240. Each of the first signal lines SL1 and the second signal lines SL2 may include both (e.g., simultaneously) a line formed from the first conductive layer 220 and a line formed from the second conductive layer 240.

Figure 7A:
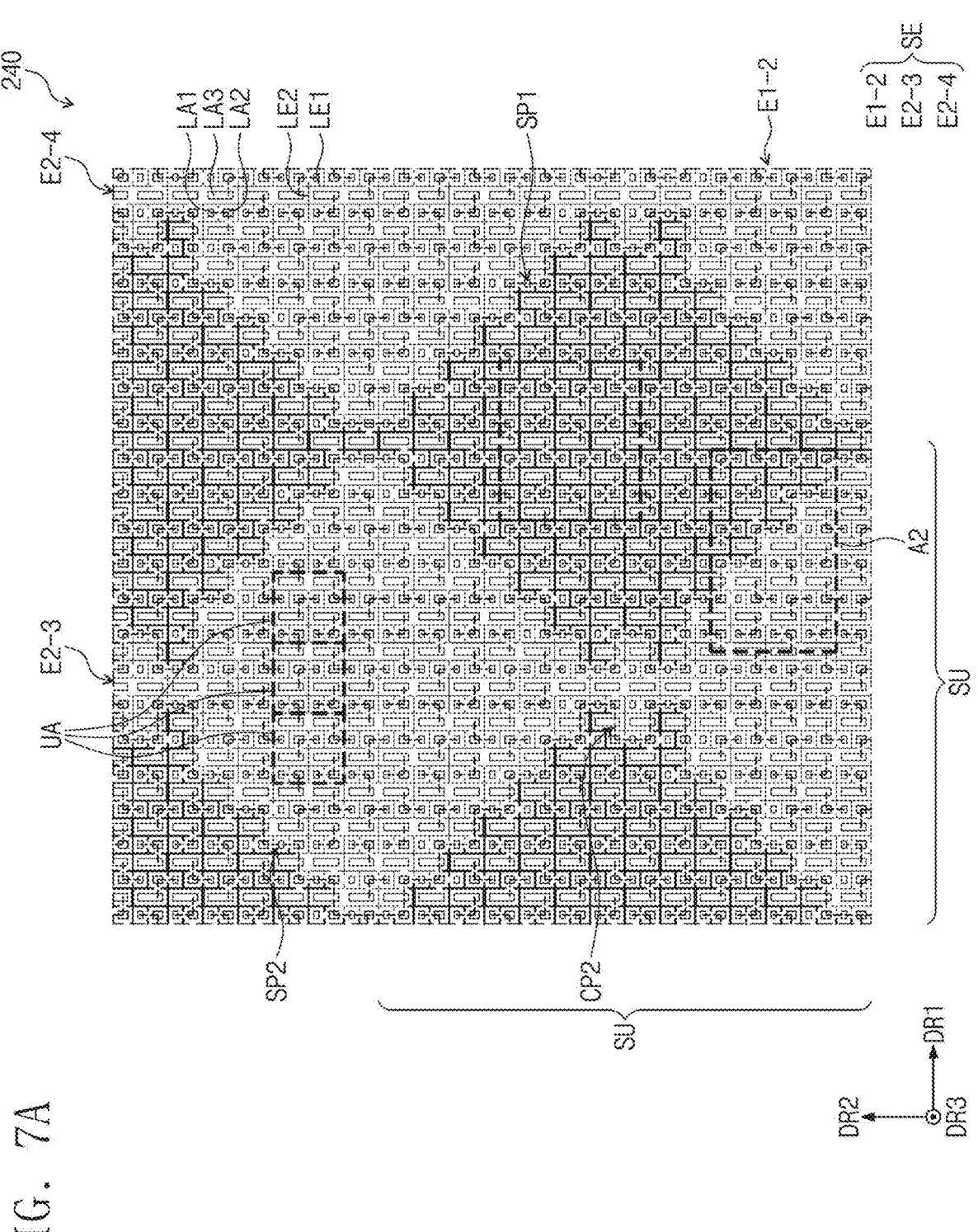
FIG. 7A is an enlarged plan view of a partial area of FIG. 6A.
Figure 7B:
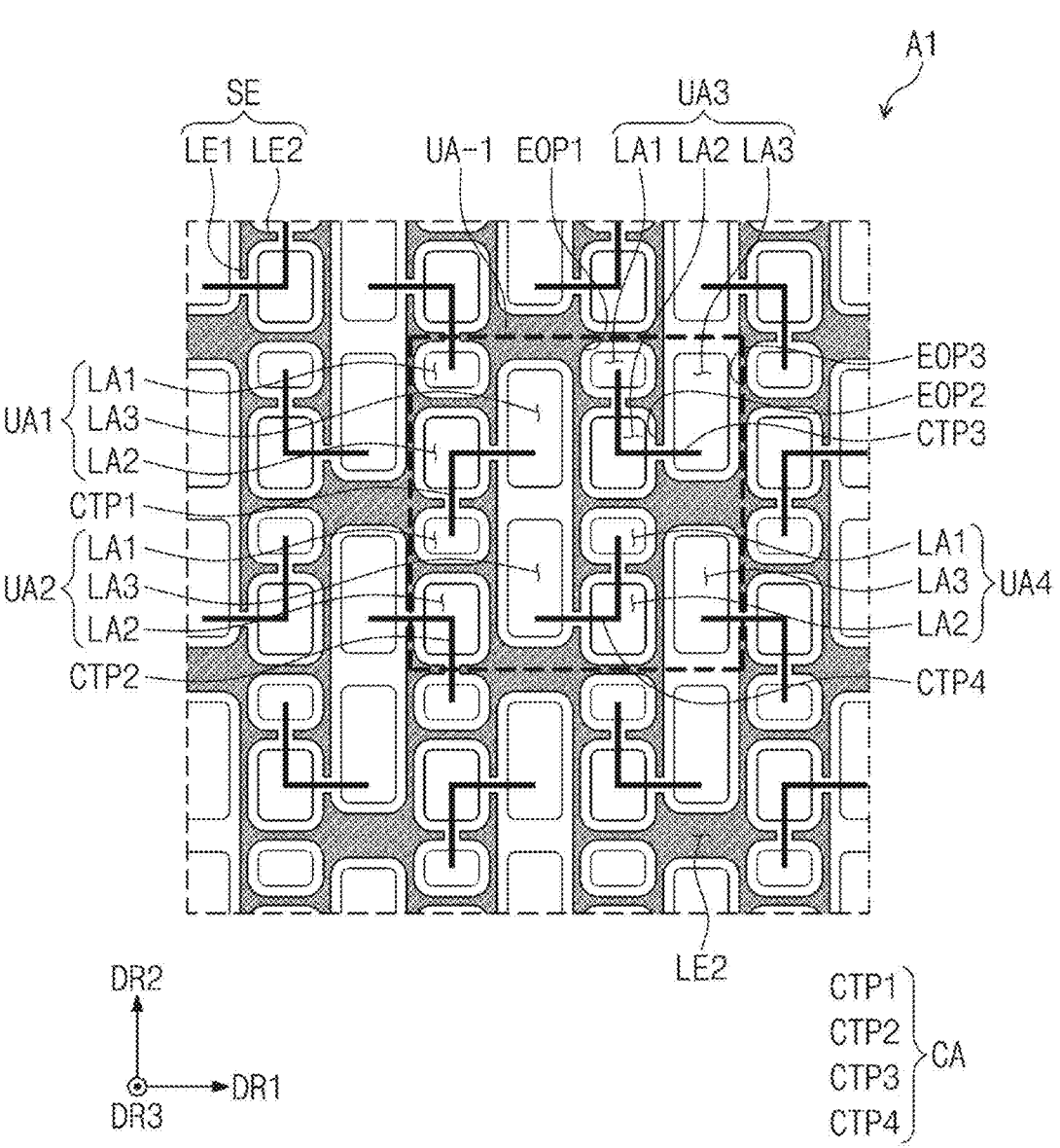
FIG. 7B is an enlarged plan view of a first area of FIG. 7A.
Figure 7C:
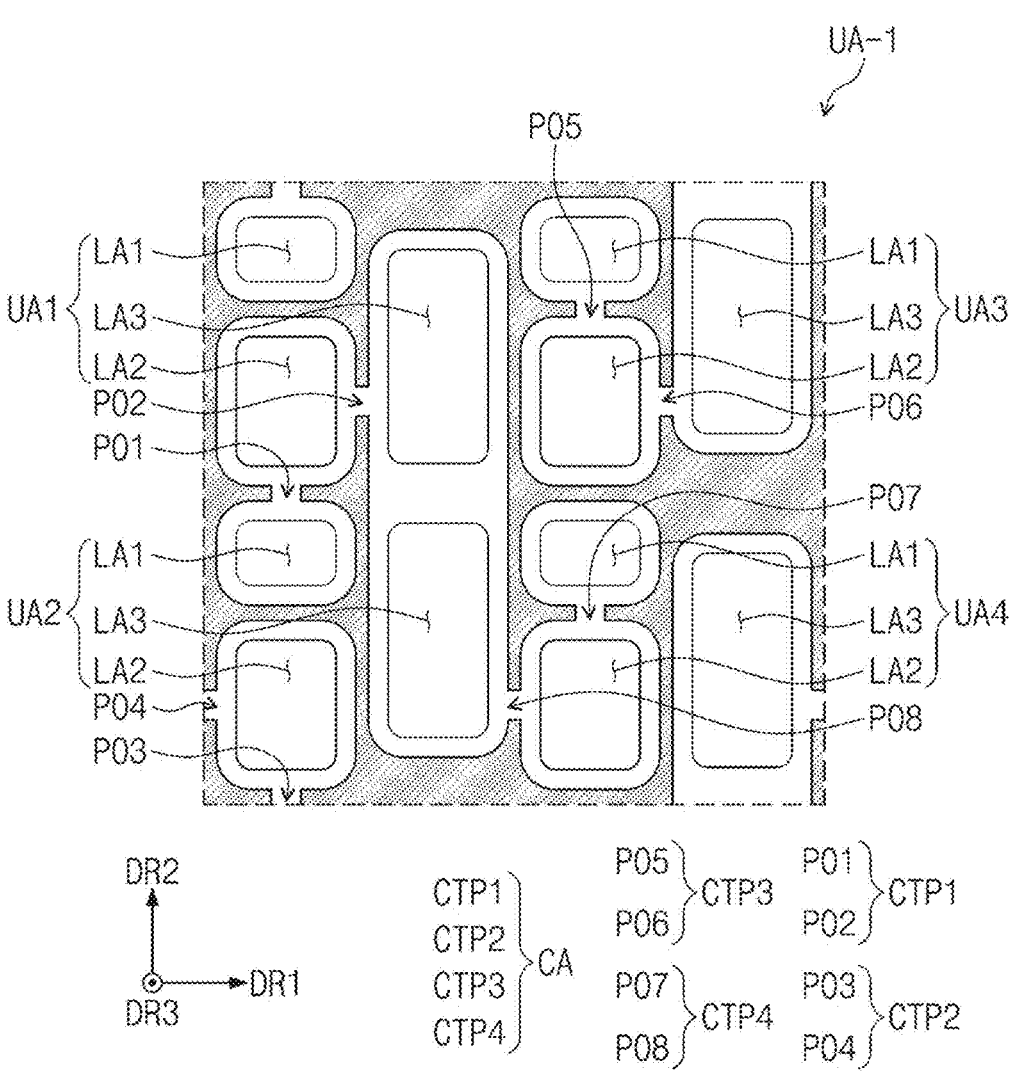
FIG. 7C is an enlarged plan view of disconnection areas corresponding to a first unit area of FIG. 7B.
Figure 7D:
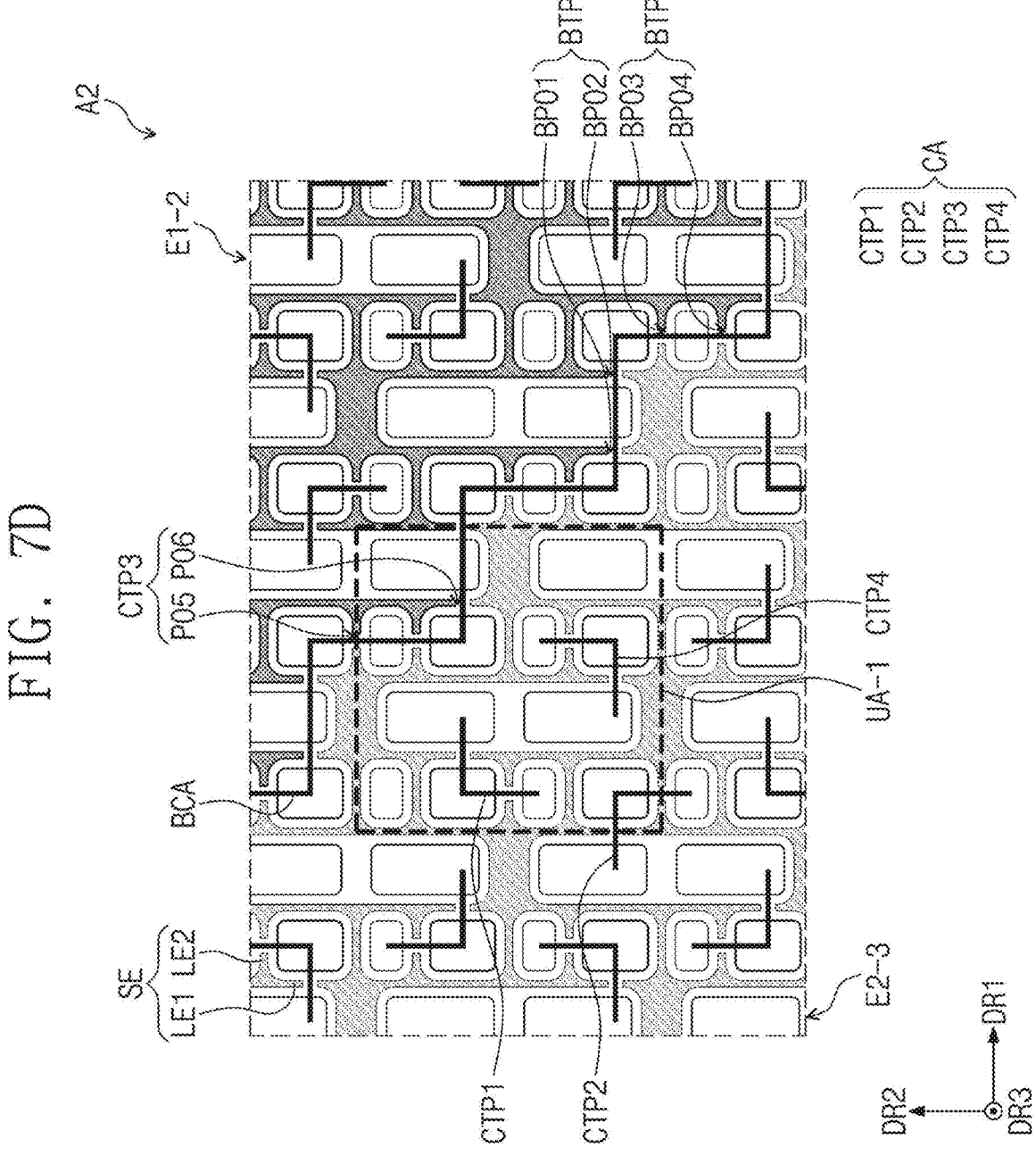
FIGS. 7D and 7E are enlarged plan views of a second area of FIG. 7A.
Figure 7E:
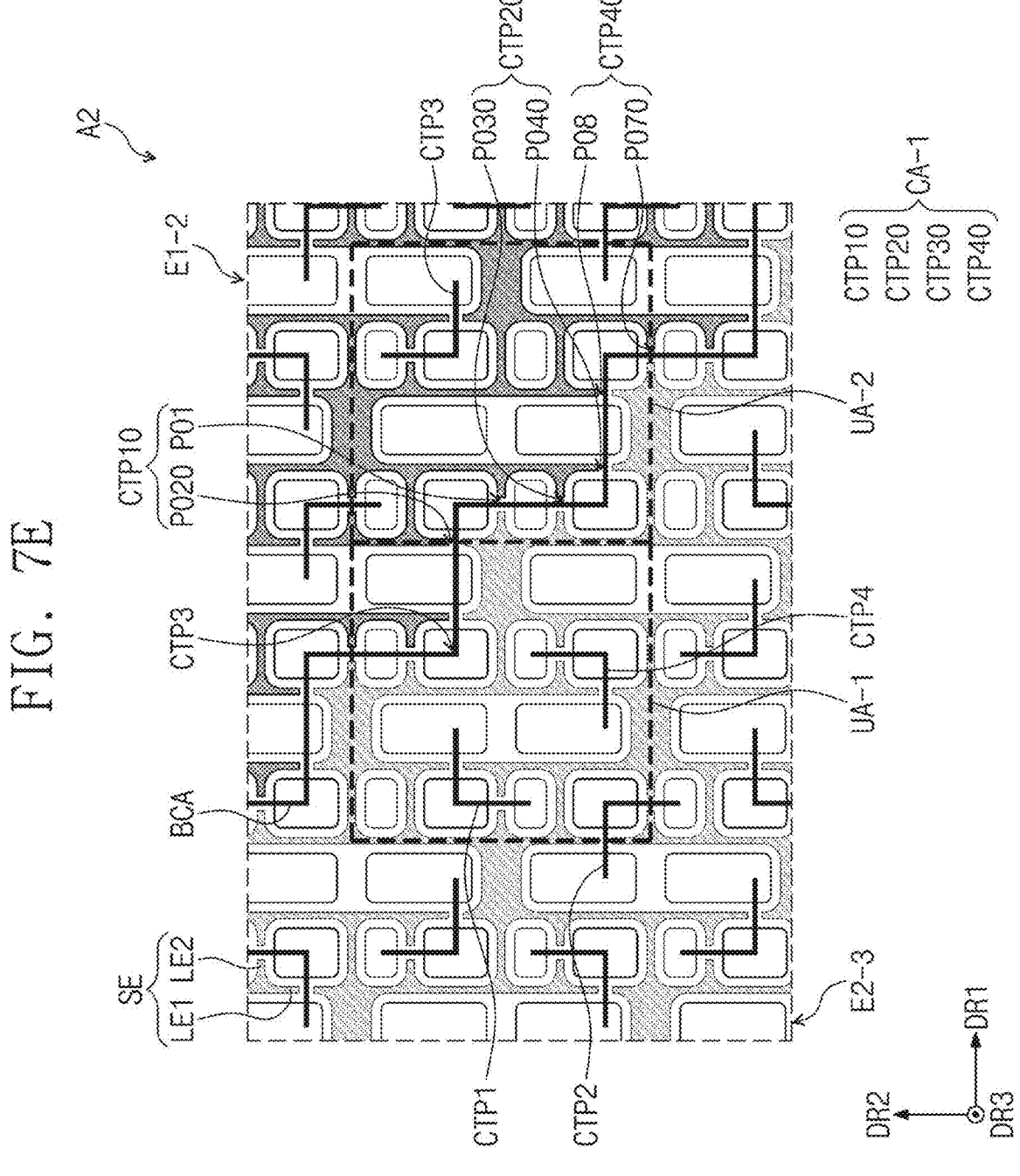

FIG. 7A is an enlarged plan view of the second conductive layer 240 corresponding to a partial area of FIG. 6A. FIG. 7B is an enlarged plan view of a first area A1 of FIG. 7A. FIG. 7C is an enlarged plan view of disconnection areas CA corresponding to a first unit area UA-1 of FIG. 7B. FIGS. 7D and 7E are enlarged plan views of a second area A2 of FIG. 7A.

In FIGS. 7A to 7E, the second conductive layer 240 refers to the second conductive layer 240 of FIG. 5. FIGS. 7A to 7E illustrate enlarged views of the second electrodes E2-3 and E2-4 and/or the sensing patterns SP1 formed from the second conductive layer 240.

Referring to FIGS. 7A to 7E, line elements of the sensing electrode SE include a first line element LE1 being further extended (e.g., extending) in the second direction DR2 and a second line element LE2 being further extended (e.g., extending) in the first direction DR1. The first line element LE1 and the second line element LE2 are arranged between the plurality of first to third color light emitting areas LA1 to LA3. For example, the first line element LE1 and the second line element LE2 may be entirely arranged in the non-light emitting area NLA.

The first line element LE1 and the second line element LE2 may define a first opening area EOP1 corresponding to (or, overlapping) the first color light emitting area LA1, a second opening area EOP2 corresponding to the second color light emitting area LA2, and a third opening area EOP3 corresponding to the third color light emitting area LA3. Substantially, the third opening area EOP3 corresponds to the light emitting area pair UP described above. A plurality of first line elements LE1 and a plurality of second line elements LE2 are entirely arranged in the non-light emitting area NLA and connected with each other to define the first opening area EOP1, the second opening area EOP2, and the third opening area EOP3.

The disconnection areas CA may be defined in the first line element LE1 and the second line element LE2 according to a set or predetermined rule. The reason why the disconnection areas CA are arranged in the first line element LE1 and the second line element LE2 according to the set or predetermined rule as will be described in more detail is to prevent or reduce the boundary areas between the first electrodes E1-1 to E1-4 and the second electrodes E2-1 to E2-7 illustrated in FIG. 6A from being visually recognized as distinct from other areas. For example, the reason is to lower the visibility of the boundary areas. Substantially, in the boundary areas, an end of a first line element LE1 and an end of a first line element LE1 may be arranged opposite to (e.g., arranged to face) each other, and an end of a second line element LE2 and an end of a second line element EL2 may be arranged opposite to (e.g., arranged to face) each other. Therefore, a large amount of external light may be reflected from the cross-sections of the corresponding line elements. The points where a large amount of external light is reflected may be relatively easily visible, and due to this, the visibility of the above-described boundary areas may be increased. The ends of the first line elements LE1 opposite to (e.g., facing) each other and the ends of the second line elements LE2 opposite to (e.g., facing) each other may be formed in an etching process of forming the first opening area EOP1, the second opening area EOP2, and the third opening area EOP3. The disconnection areas CA are also formed together in the corresponding etching process.

In other words, the first line element LE1 and the second line element LE2 define three opening areas: EOP1, EOP2, and EOP3, corresponding to the first, second, and third color light-emitting areas LA1, LA2, and LA3, respectively. The third opening area EOP3 corresponds to the light-emitting area pair UP. Multiple first and second line elements LE1 and LE2) are arranged in the non-light emitting area NLA and connected to form these opening areas. Disconnection areas CA are defined in the first and second line elements LE1 and LE2 according to a set or predetermined rule to reduce the visibility of boundary areas between the first and second electrodes (E1-1 to E1-4 and E2-1 to E2-7). These boundary areas, where the ends of the line elements face each other, can reflect a large amount of external light, making them more visible. The disconnection areas CA are formed during the etching process that creates the opening areas EOP1, EOP2, and EOP3.

In FIG. 6A, and the boundary areas between the first electrodes E1-1 to E1-4 and the second electrodes E2-1 to E2-7 are clearly visible (this refers to that the visibility is high). In contrast, in FIG. 7A, the disconnection areas CA are illustrated, and the visibility of the boundary areas between the first electrode E1-2 and the second electrodes E2-3 and E2-4 may be reduced.

To reduce the visibility of the boundary areas and facilitate a signal flow of the sensing electrode, the disconnection areas CA may be defined according to the following rule. The basic rule may be applied to each of the first electrodes E1-1 to E1-4 and the second electrodes E2-1 to E2-7 described with reference to FIG. 6A.

The disconnection area CA is defined in at least one of (1) two first line elements LE1 arranged on the opposite sides of the first color light emitting area LA1 among the first line elements LE1 or (2) two second line elements LE2 arranged on the opposite sides of the first color light emitting area LA1 among the second line elements LE2. For example, the disconnection area CA is defined in at least one of the four line elements around (e.g., surrounding) the first color light emitting area LA1. The disconnection area CA is not defined in one of the two first line elements LE1 arranged on the opposite sides of the first color light emitting area LA1 among the first line elements LE1, and the disconnection area CA is not defined in one of the two second line elements LE2 arranged on the opposite sides of the first color light emitting area LA1 among the second line elements LE2. The disconnection area CA may be formed in one of the four line elements around (e.g., surrounding) the first color light emitting area LA1 to increase the reflectivity inside the sensing electrode SE. At the same time (e.g., simultaneously), the disconnection area CA might not be formed in one of the first line elements LE1 and one of the second line elements LE2 to induce a signal flow in the first direction DR1 and in the second direction DR2. In other words, the disconnection area CA is defined in at least one of the four line elements surrounding the first color light-emitting area LA1. Specifically, it can be in at least one of the two first line elements LE1 or the two second line elements LE2 that are positioned on opposite sides of the first color light-emitting area LA1. This arrangement helps increase the reflectivity inside the sensing electrode SE and ensures signal flow in both the first direction DR1 and the second direction DR2.

The disconnection area CA is defined around the second color light emitting area LA2 according to the same rule applied to the first color light emitting area LA1. The disconnection area CA is defined in at least one of two first line elements LE1 arranged on the opposite sides of the second color light emitting area LA2 among the first line elements LE1 or two second line elements LE2 arranged on the opposite sides of the second color light emitting area LA2 among the second line elements LE2. At the same time (e.g., simultaneously), the disconnection area CA is not defined in one of the two first line elements LE1 arranged on the opposite sides of the second color light emitting area LA2 among the first line elements LE1, and the disconnection area CA is not defined in one of the two second line elements LE2 arranged on the opposite sides of the second color light emitting area LA2 among the second line elements LE2. The disconnection area CA may also be defined around the third color light emitting area LA3 according to the same rule applied to the first color light emitting area LA1.

Referring to FIG. 7A, the plurality of unit areas UA described with reference to FIG. 4A are arranged in the sensing electrode SE. In FIG. 7A, three unit areas UA are illustrated as an example. The disconnection areas CA of the same rule may be arranged in some of the plurality of unit areas UA while satisfying the above-described basic rule.

Hereinafter, a specific embodiment of the disconnection areas CA satisfying the above-described basic rule will be described in more detail with reference to FIGS. 7B and 7C. The rule of the disconnection areas CA will be described in more detail by focusing on the first unit area UA-1 illustrated in FIGS. 7B and 7C. The disconnection areas CA arranged in the first unit area UA-1, which will be described in more detail, may be identically arranged in some of the plurality of unit areas UA illustrated in FIG. 7A.

The disconnection areas CA may include first to fourth disconnection patterns CTP1 to CTP4. Each of the disconnection patterns refers to two disconnection areas formed around one light emitting area, and in FIG. 7B, the disconnection patterns are illustrated by thick lines for ease of illustration.

For example, as illustrated in FIG. 7C, the first disconnection pattern CTP1 of FIG. 7B includes a first disconnection area PO1 formed in the second line element LE2 (e.g., a portion of the second line element LE2) arranged on the lower side of the second color light emitting area LA2 and a second disconnection area PO2 formed in the first line element LE1 (e.g., a portion of the first line element LE1) arranged on the right side of the second color light emitting area LA2. According to this embodiment, the first to fourth disconnection patterns CTP1 to CTP4 are located to correspond to the first to fourth sub-areas UA1 and UA4, respectively. That is, the first disconnection area PO1 and the second disconnection area PO2 are arranged on orthogonal sides of the second color light emitting area LA2 of the first sub-area UA1.

The first disconnection pattern CTP1 corresponds to the second color light emitting area LA2 of the first sub-area UA1. The meaning of the expression "a disconnection pattern corresponds to a light emitting area" is as described in more detail. For example, both (e.g., simultaneously) the first disconnection area PO1 and the second disconnection area PO2 are located between the second color light emitting area LA2 and other light emitting areas around the second color light emitting area LA2. Two disconnection areas of one disconnection pattern are related to three light emitting areas, and the corresponding disconnection pattern is defined as corresponding to the light emitting area to which the two disconnection areas are related.

The second disconnection pattern CTP2 corresponds to the second color light emitting area LA2 of the second sub-area UA2. As illustrated in FIG. 7C, the second disconnection pattern CTP2 includes a third disconnection area PO3 defined in the second line element LE2 (e.g., a portion of the second line element LE2) arranged on one side of the second color light emitting area LA2 spaced farther away from the first color light emitting area LA1 of the second sub-area UA2 and a fourth disconnection area PO4 defined in the first line element LE1 (e.g., a portion of the first line element LE1) arranged on one side of the second color light emitting area LA2 spaced farther away from the third color light emitting area LA3 of the second sub-area UA2.

The third disconnection pattern CTP3 corresponds to the second color light emitting area LA2 of the third sub-area UA3. As illustrated in FIG. 7C, the third disconnection pattern CTP3 may include a fifth disconnection area PO5 defined in the second line element LE2 (e.g., a portion of the second line element LE2) between the first color light emitting area LA1 of the third sub-area UA3 and the second color light emitting area LA2 of the third sub-area UA3 and a sixth disconnection area PO6 defined in the first line element LE1 (e.g., a portion of the first line element LE1) between the second color light emitting area LA2 of the third sub-area UA3 and the third color light emitting area LA3 of the third sub-area UA3.

The fourth disconnection pattern CTP4 corresponds to the second color light emitting area LA2 of the fourth sub-area UA4. As illustrated in FIG. 70, the fourth disconnection pattern CTP4 includes a seventh disconnection area PO7 defined in the second line element LE2 (e.g., a portion of the second line element LE2) between the first color light emitting area LA1 of the fourth sub-area UA4 and the second color light emitting area LA2 of the fourth sub-area UA4 and an eighth disconnection area PO8 defined in the first line element LE1 (e.g., a portion of the first line element LE1) between the second color light emitting area LA2 of the fourth sub-area UA4 and the third color light emitting area LA3 of the second sub-area UA2.

Referring to FIGS. 7B and 7C, the third opening area EOP3 in which the third color light emitting area LA3 of the third sub-area UA3 is arranged and the third opening area EOP3 in which the third color light emitting area LA3 of the fourth sub-area UA4 is arranged are opening areas different from each other. In one or more embodiments, the second line element LE2 arranged between the third color light emitting area LA3 of the third sub-area UA3 and the third color light emitting area LA3 of the fourth sub-area UA4 may have a line width greater than those of the second line elements LE2 arranged in other positions.

The second line element LE2 arranged between the third color light emitting area LA3 of the third sub-area UA3 and the third color light emitting area LA3 of the fourth sub-area UA4 may have a line width greater than that of the second line element LE2 arranged between the first color light emitting area LA1 and the second color light emitting area LA2 of each of the first to fourth sub-areas UA1 to UA4. In one or more embodiments, the second line element LE2 arranged between the third color light emitting area LA3 of the third sub-area UA3 and the third color light emitting area LA3 of the fourth sub-area UA4 may have a line width greater than that of the second line element LE2 arranged between the second color light emitting area LA2 and the first color light emitting area LA1 of two sub-areas adjacent to each other in the second direction DR2 among the first to fourth sub-areas UA1 to UA4.

In the first unit area UA-1, the second line elements LE2 arranged in the other positions other than the second line element LE2 arranged between the third color light emitting area LA3 of the third sub-area UA3 and the third color light emitting area LA3 of the fourth sub-area UA4 may have the same line width. For example, the second line element LE2 arranged between the second color light emitting area LA2 of the third sub-area UA3 and the first color light emitting area LA1 of the fourth sub-area UA4 may have the same line width as the second line element LE2 arranged between the first color light emitting area LA1 and the second color light emitting area LA2 of the third sub-area UA3. The second line element LE2 arranged between the second color light emitting area LA2 of the third sub-area UA3 and the first color light emitting area LA1 of the fourth sub-area UA4 may have the same line width as the second line element LE2 arranged between the first color light emitting area LA1 and the second color light emitting area LA2 of each of the first to fourth sub-areas UA1 to UA4.

FIG. 7D is an enlarged view illustrating the boundary area between the first electrode E1-2 and the second electrode E2-3.

In the boundary area between the first electrode E1-2 and the second electrode E2-3, the end of the first line element LE1 of the first electrode E1-2 and the end of the first line element LE1 of the second electrode E2-3 are spaced and/or apart (e.g., spaced apart or separated) from each other and are opposite each other (e.g., face each other). In one or more embodiments, in the boundary area between the first electrode E1-2 and the second electrode E2-3, the end of the second line element LE2 of the first electrode E1-2 and the end of the second line element LE2 of the second electrode E2-3 are spaced and/or apart (e.g., spaced apart or separated) from each other and are opposite each other (e.g., face each other).

The boundary area between the first electrode E1-2 and the second electrode E2-3 is formed by forming a boundary disconnection area BCA in the first line element LE1 having a one-body shape and the second line element LE2 having a one-body shape. In FIG. 7D, the boundary disconnection area BCA is illustrated by a thick line for ease of illustration.

The boundary disconnection area BCA may include a first boundary disconnection pattern BTP1 and a second boundary disconnection pattern BTP2. The first boundary disconnection pattern BTP1 includes a first boundary disconnection area BPO1 and a second boundary disconnection area BPO2 that are formed in two first line elements LE1, respectively, which are arranged on the opposite sides of one light emitting area. In this embodiment, the first boundary disconnection pattern BTP1 may be arranged to correspond to the third color light emitting area LA3. In one or more embodiments, the first boundary disconnection pattern BTP1 is formed in the first line element LE1 arranged between the third color light emitting area LA3 and the second color light emitting area LA2. Because the first boundary disconnection pattern BTP1 cuts the first line elements LE1, the first boundary disconnection pattern BTP1 electrically disconnects the first electrode E1-2 and the second electrode E2-3 in the second direction DR2.

The second boundary disconnection pattern BTP2 includes a third boundary disconnection area BPO3 and a fourth boundary disconnection area BPO4 that are formed in two second line elements LE2, respectively, which are arranged on the opposite sides of one light emitting area. In this embodiment, the second boundary disconnection pattern BTP2 may be arranged to correspond to the first color light emitting area LA1. Because the second boundary disconnection pattern BTP2 cuts the second line elements LE2, the second boundary disconnection pattern BTP2 electrically disconnects the first electrode E1-2 and the second electrode E2-3 in the first direction DR1.

Two second line elements LE2 arranged in the boundary area between the first electrode E1-2 and the second electrode E2-3 and arranged on the opposite sides of the first color light emitting area LA1 have a shorter length than a non-disconnected second line element LE2 arranged in each of the first electrode E1-2 and the second electrode E2-3 and arranged on one side of the first color light emitting area LA1. The above-described two second line elements LE2 arranged in the boundary area have substantially the same length as a disconnected second line element LE2 arranged in each of the first electrode E1-2 and the second electrode E2-3 and arranged on one side of the first color light emitting area LA1. The length measures the value of a disconnected first line element LE1 being further extended (e.g., extending) from the second line element LE2 in the first direction DR1.

The boundary disconnection area BCA may include a plurality of first boundary disconnection patterns BTP1 and a plurality of second boundary disconnection patterns BTP2. The plurality of first boundary disconnection patterns BTP1 and the plurality of second boundary disconnection patterns BTP2 may alternate with one another.

In FIG. 7D, the first unit area UA-1 described with reference to FIGS. 7B and 7C is illustrated. Some of the first to fourth disconnection patterns CTP1 to CTP4 arranged in the first unit area UA-1 may constitute the boundary disconnection area BCA. At least one of the first to eighth disconnection areas PO1 to PO8 (refer to FIG. 7C) of the unit area UA may correspond to the first to fourth boundary disconnection areas BPO1 to BPO4 of the boundary disconnection area BCA.

For example, FIG. 7D illustrates one or more embodiments in which the fifth disconnection area PO5 of the third disconnection pattern CTP3 corresponds to the fourth boundary disconnection areas BPO4 and the sixth disconnection area PO6 of the third disconnection pattern CTP3 corresponds to the first boundary disconnection areas BPO1.

FIG. 7E is an enlarged view illustrating the boundary area between the first electrode E1-2 and the second electrode E2-3 that is the same as that in FIG. 7D. A second unit area UA-2 adjacent to the first unit area UA-1 is additionally illustrated in FIG. 7E. Disconnection areas CA-1 that satisfy the basic rule described in more detail with reference to FIG. 7A, but are different from the disconnection areas CA of the first unit area UA-1 illustrated in FIGS. 7B and 7D are arranged in the second unit area UA-2.

The disconnection areas CA-1 of the second unit area UA-2 may include a first disconnection pattern CTP10, a second disconnection pattern CTP20, a third disconnection pattern CTP3, and a fourth disconnection pattern CTP40. The disconnection areas CA-1 of the second unit area UA-2 may differ from the disconnection areas CA of the first unit area UA-1 in terms of the first disconnection pattern CTP10, the second disconnection pattern CTP20, and the fourth disconnection pattern CTP40.

As illustrated in FIG. 7E, the first disconnection pattern CTP10 includes a first disconnection area PO1 formed in the second line element LE2 arranged on the lower side of the second color light emitting area LA2 and a second disconnection area PO20 formed in the first line element LE1 arranged on the left side of the second color light emitting area LA2. The second disconnection pattern CTP20 corresponds to the second color light emitting area LA2 of the second sub-area UA2. The second disconnection pattern CTP20 includes a third disconnection area PO30 defined in the second line element LE2 (e.g., a portion of the second line element LE2) arranged between the first color light emitting area LA1 and the second color light emitting area LA2 and a fourth disconnection area PO40 defined in the first line element LE1 arranged on the right side of the third color light emitting area LA3. That is, the third disconnection area PO30 is arranged on a side of the second color light emitting area of the second sub-area that is spaced farther away from the first color light emitting area of the second sub-area corresponding to the first unit area than other sides of the second color light emitting area of the second sub-area. Further, the fourth disconnection area PO40 is on a side of the second color light emitting area of the second color light emitting area of the second sub-area spaced farther away from the third color light emitting area of the second sub-area corresponding to the first unit area than other sides of the second color light emitting area of the second sub-area. The fourth disconnection pattern CTP40 includes a seventh disconnection area PO70 defined in the second line element LE2 arranged on the lower side of the second color light emitting area LA2 and an eighth disconnection area PO8 defined in the first line element LE1 arranged on the left side of the second color light emitting area LA2.

To constitute the boundary disconnection area BCA, at least some of the first disconnection pattern CTP10, the second disconnection pattern CTP20, and the fourth disconnection pattern CTP40 may be different from the first disconnection pattern CTP1, the second disconnection pattern CTP2, and the fourth disconnection pattern CTP4 of the first unit area UA-1 illustrated in FIGS. 7B to 7D.

Figure 8A:
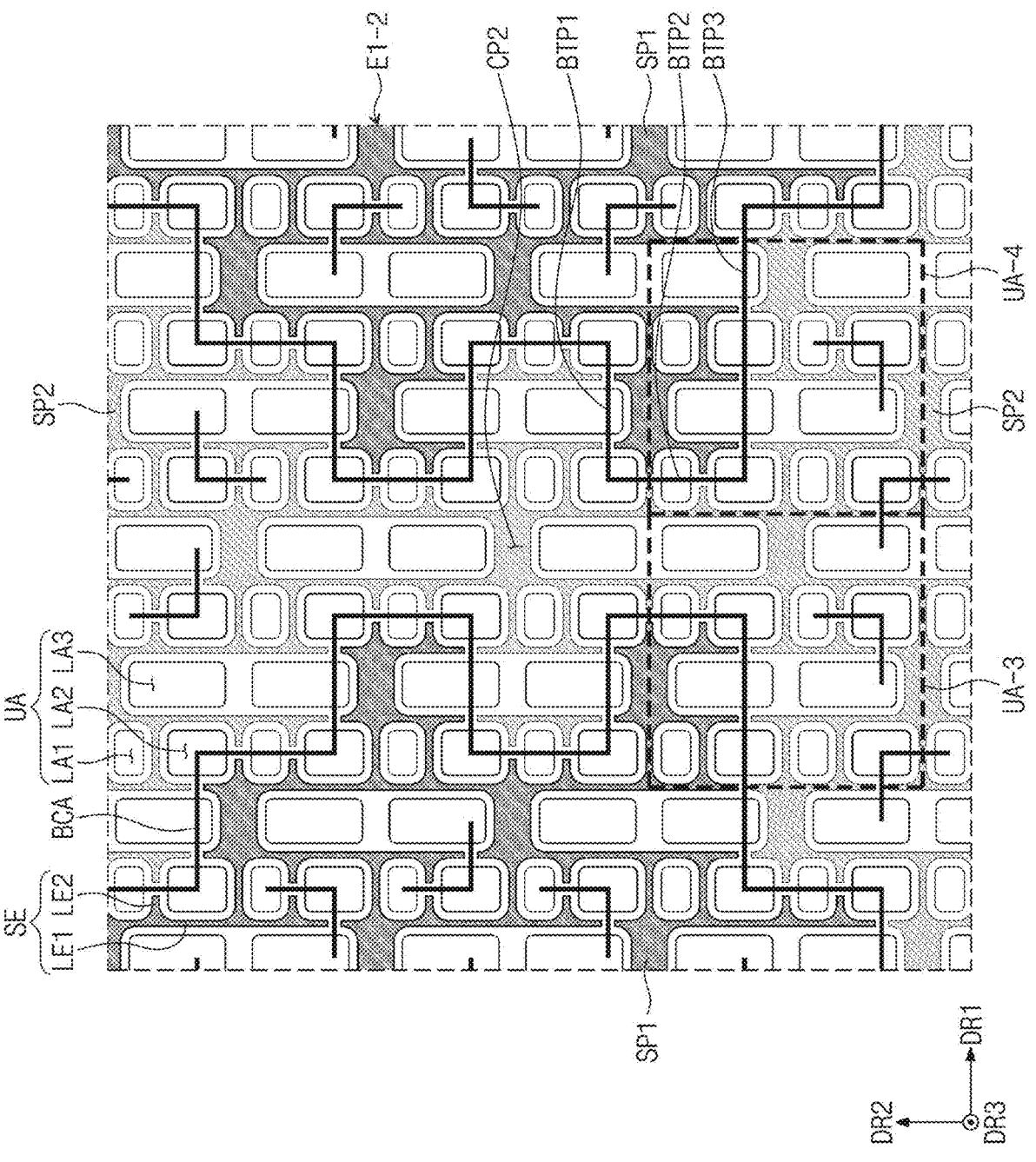
FIGS. 8A and 8B are enlarged plan views of a partial area of the input sensor according to one or more embodiments of the present disclosure.
Figure 8B:
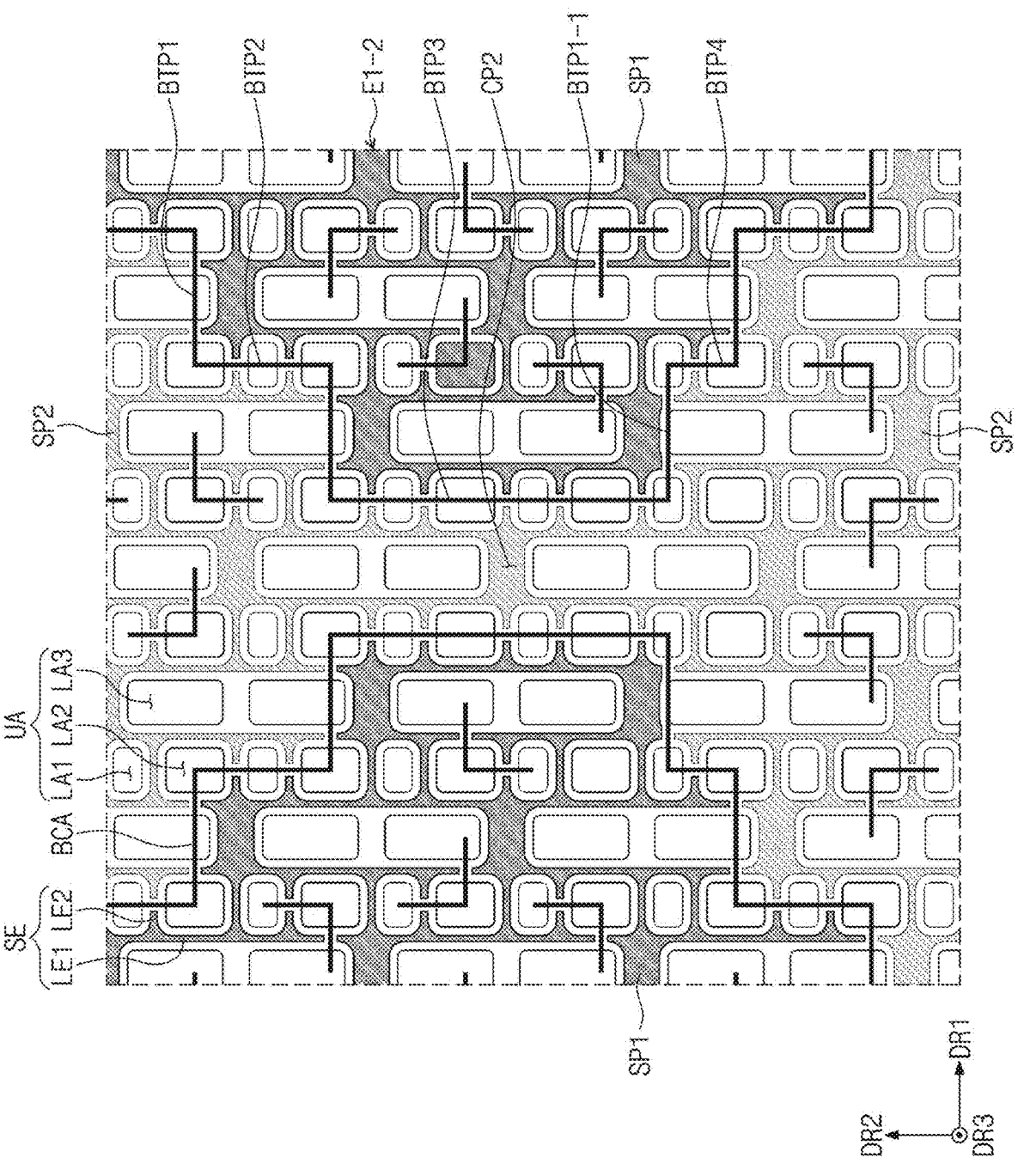

FIGS. 8A and 8B are enlarged plan views of a partial area of the input sensor according to one or more embodiments of the present disclosure.

FIGS. 8A and 8B are enlarged views of the intersection area of the first electrode E1-2 and the second electrode E2-3 illustrated in FIG. 7A. Although the bridge pattern CP1 described in more detail with reference to FIG. 6A is arranged in the intersection area of the first electrode E1-2 and the second electrode E2-3, only the second conductive layer 240 of FIG. 5 is illustrated in FIGS. 8A and 8B.

Referring to FIG. 8A, in the intersection area of the first electrode E1-2 and the second electrode E2-3, boundary areas are formed between the sensing patterns SP1 of the first electrode E1-2 and the sensing parts SP2 and the intermediate part CP2 of the second electrode E2-3. A boundary disconnection area BCA is illustrated by a thick line. The boundary disconnection area BCA may include first boundary disconnection patterns BTP1 and second boundary disconnection patterns BTP2. The first boundary disconnection patterns BTP1 and the second boundary disconnection patterns BTP2 may be alternately arranged in a partial area of the boundary disconnection area BCA, and the boundary disconnection area BCA may further include third boundary disconnection patterns BTP3.

The third boundary disconnection patterns BTP3 include disconnection areas formed in all line elements arranged between four or more light emitting areas that are continuously arranged. In this embodiment, the third boundary disconnection patterns BTP3 include four disconnection areas formed in four first line elements LE1 arranged between five light emitting areas in the first direction DR1. In this embodiment, the third boundary disconnection patterns BTP3 may be substantially the same as two first boundary disconnection patterns BTP1 that are continuously arranged.

In FIG. 8B, a third unit area UA-3 and a fourth unit area UA-4 are illustrated as examples. Although the third unit area UA-3 and the fourth unit area UA-4 satisfy the basic rule described with reference to FIG. 7A, disconnection areas different from the disconnection areas CA of the first unit area UA-1 illustrated in FIGS. 7B and 7D are arranged. This is because, likewise to the second unit area UA-2, at least partial disconnection areas of the third unit area UA-3 and the fourth unit area UA-4 constitute the boundary disconnection area BCA.

Referring to FIG. 8B, a boundary disconnection area BCA having a shape different from the shape of the boundary disconnection area BCA of FIG. 8A is illustrated. The shape of the intermediate part CP2 may be determined by the shape of the boundary disconnection area BCA. The boundary disconnection area BCA may include first boundary disconnection patterns BTP1 and second boundary disconnection patterns BTP2.

In one or more embodiments, the boundary disconnection area BCA may further include first-first boundary disconnection patterns BTP1-1. The first-first boundary disconnection patterns BTP1-1 are formed in two first line elements LE1 arranged on the opposite sides of the third color light emitting area LA3. However, unlike the first boundary disconnection pattern BTP1, the first-first boundary disconnection patterns BTP1-1 are formed in the first line elements LE1 arranged between the third color light emitting area LA3 and the first color light emitting areas LA1.

Third boundary disconnection patterns BTP3 according to this embodiment include five disconnection areas formed in five second line elements LE2 arranged between six light emitting areas continuously arranged in the second direction DR2.

In one or more embodiments, the boundary disconnection area BCA may further include a fourth boundary disconnection pattern BTP4. The fourth boundary disconnection pattern BTP4 may be formed in one line element arranged between two adjacent light emitting areas. In this embodiment, the fourth boundary disconnection pattern BTP4 may be formed in the second line element LE2 arranged between the first color light emitting area LA1 and the second color light emitting area LA2.

According to the present disclosure, the disconnection areas may be arranged according to the set or predetermined rule in the sensing electrodes. Accordingly, the phenomenon in which the boundary areas between the sensing electrodes are clearly visible may be reduced. This is because the amount of external light reflected by the boundary areas is similar to the amount of external light reflected by the sensing electrodes.

The line elements being further extended (e.g., extending) in the first direction and the line elements being further extended (e.g., extending) in the second direction may be arranged based on each of the light emitting areas. Accordingly, a current flow in the sensing electrodes in the first or second direction may be facilitated.

The display device, the electronic apparatus, the electronic equipment, a device for manufacturing of the same, or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

A person of ordinary skill in the art, in view of the present disclosure in its entirety, would appreciate that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

While the present disclosure has been described with reference to one or more embodiments thereof, it will be apparent to those of ordinary skill in the art that one or more suitable changes and modifications may be made thereto without departing from the spirit and scope of the present disclosure as set forth in the following claims and equivalents thereof.

What is claimed is:

1. A display device comprising:
    a display panel comprising a plurality of unit areas, each unit area of the plurality of unit areas comprises first, second, third, and fourth sub-areas, each of the first, second, third, and fourth sub-areas comprising a first color light emitting area, a second color light emitting area, and a third color light emitting area; and
    an input sensor on the display panel, the input sensor comprising a sensing electrode,
    wherein in each of the first, second, third, and fourth sub-areas, the third color light emitting area is on one side of each of the first, second, third, and fourth sub-areas in a first direction from the first color light emitting area and the second color light emitting area, and the first color light emitting area is aligned with the second color light emitting area in a second direction crossing the first direction, the second direction being substantially perpendicular to the first direction,
    wherein the first sub-area and the second sub-area are aligned with each other in the second direction, the third sub-area and the fourth sub-area are aligned with each other in the second direction, the third sub-area is on the one side of the first sub-area in the first direction from the first sub-area, and the fourth sub-area is on the one side of the second sub-area in the first direction from the second sub-area,
    wherein the sensing electrode comprises a line element defining a first opening area, a second opening area, and a third opening area corresponding to the first color light emitting area, the second color light emitting area, and the third color light emitting area, respectively,
    wherein the line element comprises a first line element being further extended in the second direction and a second line element being further extended in the first direction, wherein a first disconnection area is defined in a portion of the second line element between the second color light emitting area of the first sub-area and the first color light emitting area of the second sub-area, corresponding to a first unit area among the plurality of unit areas, and a second disconnection area is defined in a portion of the first line element between the second color light emitting area of the first sub-area and the third color light emitting area of the first sub-area, corresponding to the first unit area, wherein a third disconnection area is defined in a portion of the second line element on a side of the second color light emitting area of the second sub-area, spaced farther away from the first color light emitting area of the second sub-area, than other sides of the second color light-emitting area, corresponding to the first unit area, and a fourth disconnection area is defined in a portion of the first line element on a side of the second color light emitting area of the second sub-area spaced farther away from the third color light emitting area of the second sub-area than other sides of the second color light-emitting area, corresponding to the first unit area, wherein a fifth disconnection area is defined in a portion of the second line element between the first color light emitting area of the third sub-area and the second color light emitting area of the third sub-area corresponding to the first unit area, and a sixth disconnection area is defined in a portion of the first line element between the second color light emitting area of the third sub-area and the third color light emitting area of the third sub-area corresponding to the first unit area, and wherein a seventh disconnection area is defined in a portion of the second line element between the first color light emitting area of the fourth sub-area and the second color light emitting area of the fourth sub-area corresponding to the first unit area, and an eighth disconnection area is defined in a portion of the first line element between the second color light emitting area of the fourth sub-area and the third color light emitting area of the second sub-area corresponding to the first unit area.

2. The display device of claim 1, wherein the third color light emitting area of the first sub-area and the third color light emitting area of the second sub-area are in the third opening area.

3. The display device of claim 2, wherein the third opening area where the third color light emitting area of the third sub-area and the third opening area where the third color light emitting area of the fourth sub-area are different opening areas from each other.

4. The display device of claim 3, wherein a portion of the second line element between the third color light emitting area of the third sub-area and the third color light emitting area of the fourth sub-area has a line width greater than a line width of a portion of the second line element between the second color light emitting area of the third sub-area and the first color light emitting area of the fourth sub-area.

5. The display device of claim 4, wherein a portion of the second line element between the second color light emitting area of the third sub-area and the first color light emitting area of the fourth sub-area has substantially the same line width as a portion of the second line element between the first color light emitting area of the third sub-area and the second color light emitting area of the third sub-area.

6. The display device of claim 3, wherein a first gap between the third color light emitting area of the first sub-area and the third color light emitting area of the second sub-area is smaller than a second gap between the third color light emitting area of the third sub-area and the third color light emitting area of the fourth sub-area.

7. The display device of claim 1, wherein the sensing electrode comprises a first sensing electrode and a second sensing electrode adjacent to each other, wherein an end of the line element of the first sensing electrode and an end of the line element of the second sensing electrode are spaced apart from each other between the first sensing electrode and the second sensing electrode to define a boundary disconnection area, and wherein at least one of the first to eighth disconnection areas is the boundary disconnection area between the first sensing electrode and the second sensing electrode.

8. The display device of claim 7, wherein the plurality of unit areas comprise a second unit area different from the first unit area, wherein the first to eighth disconnection areas are defined in a line element corresponding to the first unit area, and wherein disconnection areas arranged differently from the first to eighth disconnection areas are defined in the line element corresponding to the second unit area.

9. The display device of claim 1, wherein the first color light emitting area has a smaller area than the second color light emitting area, and the third color light emitting area has a larger area than the second color light emitting area.

10. The display device of claim 1, wherein the line element comprises a first metal layer and a second metal layer on the first metal layer, and wherein the first metal layer has a higher electrical conductivity and a higher reflectivity than the second metal layer.

11. A display device comprising:

a display panel comprising a plurality of unit areas, each unit area of the plurality of unit areas comprises first, second, third, and fourth sub-areas, each of the first, second, third, and fourth sub-areas comprising a first color light emitting area, a second color light emitting area, and a third color light emitting area; and an input sensor on the display panel, the input sensor comprising a first sensing electrode and a second sensing electrode, wherein in each of the first, second, third, and fourth sub-areas, the third color light emitting area is on one side of each of the first, second, third, and fourth sub-areas in a first direction from the first color light emitting area and the second color light emitting area, and the first color light emitting area is aligned with the second color light emitting area in a second direction perpendicular to the first direction, the second direction being substantially perpendicular to the first direction, wherein the first sub-area and the second sub-area are aligned with each other in the second direction, the third sub-area and the fourth sub-area are aligned with each other in the second direction, the third sub-area is on the one side of the first sub-area in the first direction from the first sub-area, and the fourth sub-area is on the one side of the second sub-area in the first direction from the second sub-area, wherein each of the first sensing electrode and the second sensing electrode comprises a line element defining a first opening area, a second opening area, and a third opening area corresponding to the first color light emitting area, the second color light emitting area, and the third color light emitting area, respectively, wherein the line element of the first sensing electrode and the line element of the second sensing electrode each comprise first line elements being further extended in the second direction and second line elements being further extended in the first direction, wherein a portion of a disconnection area is defined in at least one of two first line elements on opposite sides of the first color light emitting area, selected from among the first line elements of each of the first sensing electrode and the second sensing electrode and defined in at least one of two second line elements on opposite sides of the first color light emitting area, selected from among the second line elements of each of the first sensing electrode and the second sensing electrode, wherein a portion of the disconnection area is not defined in one of the two first line elements on the opposite sides of the first color light emitting area, selected from among the first line elements of each of the first sensing electrode and the second sensing electrode, and wherein a portion of the disconnection area is not defined in one of the two second line elements on the opposite sides of the first color light emitting area, selected from among the second line elements of each of the first sensing electrode and the second sensing electrode.

12. The display device of claim 11, wherein the third color light emitting area of the first sub-area and the third color light emitting area of the second sub-area are in the third opening area.

13. The display device of claim 12, wherein a portion of the third opening area where the third color light emitting area of the third sub-area and a portion of the third opening area where the third color light emitting area of the fourth sub-area are different opening areas from each other.

14. The display device of claim 13, wherein the second line elements between the third color light emitting area of the third sub-area and the third color light emitting area of the fourth sub-area have a line width greater than a line width of the second line elements between the second color light emitting area of the third sub-area and the first color light emitting area of the fourth sub-area.

15. The display device of claim 14, wherein the second line elements between the second color light emitting area of the third sub-area and the first color light emitting area of the fourth sub-area have substantially the same line width as the second line elements between the first color light emitting area of the third sub-area and the second color light emitting area of the third sub-area.

16. The display device of claim 13, wherein a first gap between the third color light emitting area of the first sub-area and the third color light emitting area of the second sub-area is smaller than a second gap between the third color light emitting area of the third sub-area and the third color light emitting area of the fourth sub-area.

17. The display device of claim 11, wherein an end of the line element of the first sensing electrode and an end of the line element of the second sensing electrode are spaced apart from each other between the first sensing electrode and the second sensing electrode to define a boundary disconnection area.

18. The display device of claim 11, wherein two second line elements on opposite sides of the first color light emitting area, and selected from among the second line elements of the first sensing electrode and two second line elements on opposite sides of the first color light emitting area and selected from among the second line elements of the second sensing electrode, are spaced apart from each other between the first sensing electrode and the second sensing electrode to define two boundary disconnection areas.

19. The display device of claim 18, wherein the two second line elements of the first sensing electrode on the opposite sides of the first color light emitting area and defining the boundary disconnection areas, each have substantially the same length as a disconnected second line element defining the first sensing electrode and on one side of the first color light emitting area.

20. The display device of claim 11, wherein between the first sensing electrode and the second sensing electrode, two first line elements on opposite sides of the third color light emitting area and selected from among the first line elements of the first sensing electrode, are spaced apart from the second sensing electrode to define two boundary disconnection areas.

21. An electronic device comprising:
a display device; and
a housing accommodating the display device, wherein the display device includes:
a display panel comprising a plurality of unit areas, each unit area of the plurality of unit areas comprises first, second, third, and fourth sub-areas, each of the first, second, third, and fourth sub-areas comprising a first color light emitting area, a second color light emitting area, and a third color light emitting area; and
an input sensor on the display panel, the input sensor comprising a sensing electrode,
wherein in each of the first, second, third, and fourth sub-areas, the third color light emitting area is on one side of each of the first, second, third, and fourth sub-areas in a first direction from the first color light emitting area and the second color light emitting area, and the first color light emitting area is aligned with the second color light emitting area in a second direction crossing the first direction, the second direction being substantially perpendicular to the first direction,
wherein the first sub-area and the second sub-area are aligned with each other in the second direction, the third sub-area and the fourth sub-area are aligned with each other in the second direction, the third sub-area is on the one side of the first sub-area in the first direction from the first sub-area, and the fourth sub-area is on the one side of the second sub-area in the first direction from the second sub-area,
wherein the sensing electrode comprises a line element defining a first opening area, a second opening area, and a third opening area corresponding to the first color light emitting area, the second color light emitting area, and the third color light emitting area, respectively,
wherein the line element comprises a first line element being further extended in the second direction and a second line element being further extended in the first direction,
wherein a first disconnection area is defined in a portion of the second line element between the second color light emitting area of the first sub-area and the first color light emitting area of the second sub-area, corresponding to a first unit area among the plurality of unit areas, and a second disconnection area is defined in a portion of the first line element between the second color light emitting area of the first sub-area and the third color light emitting area of the first sub-area, corresponding to the first unit area, wherein a third disconnection area is defined in a portion of the second line element on a side of the second color light emitting area of the second sub-area, spaced farther away from the first color light emitting area of the second sub-area, than other sides of the second color light-emitting area, corresponding to the first unit area, and a fourth disconnection area is defined in a portion of the first line element on a side of the second color light emitting area of the second sub-area spaced farther away from the third color light emitting area of the second sub-area than other sides of the second color light-emitting area, corresponding to the first unit area, wherein a fifth disconnection area is defined in a portion of the second line element between the first color light emitting area of the third sub-area and the second color light emitting area of the third sub-area corresponding to the first unit area, and a sixth disconnection area is defined in a portion of the first line element between the second color light emitting area of the third sub-area and the third color light emitting area of the third sub-area corresponding to the first unit area, and wherein a seventh disconnection area is defined in a portion of the second line element between the first color light emitting area of the fourth sub-area and the second color light emitting area of the fourth sub-area corresponding to the first unit area, and an eighth disconnection area is defined in a portion of the first line element between the second color light emitting area of the fourth sub-area and the third color light emitting area of the second sub-area corresponding to the first unit area.

22. The electronic device of claim 21, wherein the third color light emitting area of the first sub-area and the third color light emitting area of the second sub-area are in the third opening area.

23. The electronic device of claim 22, wherein the third opening area where the third color light emitting area of the third sub-area and the third opening area where the third color light emitting area of the fourth sub-area are different opening areas from each other.

24. The electronic device of claim 23, wherein a portion of the second line element between the third color light emitting area of the third sub-area and the third color light emitting area of the fourth sub-area has a line width greater than a line width of a portion of the second line element between the second color light emitting area of the third sub-area and the first color light emitting area of the fourth sub-area.

25. The electronic device of claim 24, wherein a portion of the second line element between the second color light emitting area of the third sub-area and the first color light emitting area of the fourth sub-area has substantially the same line width as a portion of the second line element between the first color light emitting area of the third sub-area and the second color light emitting area of the third sub-area.

* * * * *